United States Patent
Suga et al.

(10) Patent No.: US 11,693,049 B2
(45) Date of Patent: Jul. 4, 2023

(54) SENSOR TEST APPARATUS

(71) Applicant: ADVANTEST Corporation, Tokyo (JP)

(72) Inventors: Kazunari Suga, Tokyo (JP); Daisuke Takano, Tokyo (JP); Satoshi Hanamura, Tokyo (JP); Michiro Chiba, Tokyo (JP); Hisao Nishizaki, Tokyo (JP); Atsushi Hayakawa, Tokyo (JP)

(73) Assignee: ADVANTEST Corporation, Tokyo (JP)

( * ) Notice: Subject to any disclaimer, the term of this patent is extended or adjusted under 35 U.S.C. 154(b) by 237 days.

(21) Appl. No.: 16/575,658

(22) Filed: Sep. 19, 2019

(65) Prior Publication Data
US 2020/0191864 A1 Jun. 18, 2020

(30) Foreign Application Priority Data

Dec. 14, 2018 (JP) ................... 2018-234114

(51) Int. Cl.
*G01R 31/28* (2006.01)
*B25J 9/00* (2006.01)

(52) U.S. Cl.
CPC ..... *G01R 31/2891* (2013.01); *G01R 31/2829* (2013.01); *B25J 9/0084* (2013.01)

(58) Field of Classification Search
CPC .. G01R 31/2874–2877; G01R 31/2881; G01R 31/2862–2868
See application file for complete search history.

(56) References Cited

U.S. PATENT DOCUMENTS

| | | | |
|---|---|---|---|
| 5,541,524 A * | 7/1996 | Tuckerman | G01R 31/2863 324/750.07 |
| 6,034,524 A * | 3/2000 | Barringer | G01R 31/2887 324/750.22 |
| 6,066,822 A | 5/2000 | Nemoto et al. | |

(Continued)

FOREIGN PATENT DOCUMENTS

| CN | 1159227 A | 9/1997 |
|---|---|---|
| CN | 1576871 A | 2/2005 |

(Continued)

OTHER PUBLICATIONS

6TL-33 In-line test handler https://youtu.be/D2wJr_LXsGI?t=65 (Year: 2014).*

(Continued)

*Primary Examiner* — Patrick Assouad
*Assistant Examiner* — Demetrius R Pretlow
(74) *Attorney, Agent, or Firm* — Osha Bergman Watanabe & Burton LLP

(57) ABSTRACT

A sensor test apparatus capable of efficiently testing a sensor is provided.
A sensor test apparatus 30 which tests the pressure sensor 90 includes an application unit 40 including an application device 42 including a socket 445 to which the sensor 90 is electronically connected, a pressure chamber 43 which applies pressure to the sensor 90, and a heat sink 443,462 which applies a thermal stress to the sensor 90, the test unit 35 which tests the sensor 90 via the socket 445, and the conveying robot 33 which conveys the sensor 90 into and out of the application unit 40.

13 Claims, 20 Drawing Sheets

(56) References Cited

U.S. PATENT DOCUMENTS

| | | | |
|---|---|---|---|
| 6,111,246 A | 8/2000 | Watanabe et al. | |
| 6,111,421 A * | 8/2000 | Takahashi | G01R 31/2868 324/750.04 |
| 6,137,303 A * | 10/2000 | Deckert | G01R 31/2831 324/757.03 |
| 6,433,294 B1 | 8/2002 | Nemoto et al. | |
| 6,545,494 B1 | 4/2003 | Olsen et al. | |
| 10,823,778 B2 * | 11/2020 | Akiyama | G01R 31/2877 |
| 2002/0036161 A1 | 3/2002 | Nemoto et al. | |
| 2002/0050834 A1 * | 5/2002 | Olsen | G05D 23/1934 324/750.06 |
| 2002/0067255 A1 * | 6/2002 | Tanizawa | G01R 17/10 340/514 |
| 2005/0012498 A1 | 1/2005 | Lee et al. | |
| 2007/0222472 A1 * | 9/2007 | Raravikar | B82Y 10/00 73/774 |
| 2008/0071409 A1 | 3/2008 | Ahn et al. | |
| 2009/0015282 A1 * | 1/2009 | Steps | G01R 31/2856 324/750.01 |
| 2013/0038321 A1 | 2/2013 | Suzuki | |
| 2013/0193532 A1 | 8/2013 | Horie et al. | |
| 2014/0353778 A1 | 12/2014 | Horie et al. | |
| 2015/0160089 A1 | 6/2015 | Dawson et al. | |
| 2015/0233967 A1 * | 8/2015 | Thordarson | G11C 29/56016 324/750.14 |
| 2018/0252762 A1 * | 9/2018 | Jovanovic | H01L 21/687 |
| 2019/0011495 A1 * | 1/2019 | Hanan | G01R 31/003 |
| 2019/0170812 A1 * | 6/2019 | Nurani | G06T 7/60 |
| 2020/0018791 A1 * | 1/2020 | Endo | G01R 31/2867 |
| 2021/0333319 A1 * | 10/2021 | Konishi | G01R 31/2867 |

FOREIGN PATENT DOCUMENTS

| | | | | |
|---|---|---|---|---|
| CN | 1598609 A * | 3/2005 | | G01R 33/093 |
| CN | 101149415 A | 3/2008 | | |
| CN | 102214549 A | 10/2011 | | |
| CN | 103226400 A | 7/2013 | | |
| CN | 104697703 A | 6/2015 | | |
| CN | 206132099 U | 4/2017 | | |
| CN | 207238523 U | 4/2018 | | |
| DE | 19821194 B4 | 9/2005 | | |
| DE | 112006000019 T5 | 7/2008 | | |
| EP | 3365908 B1 * | 8/2021 | | G01M 99/008 |
| JP | H10332519 A | 12/1998 | | |
| JP | 2001-208637 A | 8/2001 | | |
| JP | 2004-503924 A | 2/2004 | | |
| JP | 2005-037394 A | 2/2005 | | |
| JP | 2008-190893 A | 8/2008 | | |
| JP | 2013-036941 A | 2/2013 | | |
| JP | 2020161631 A * | 10/2020 | | G01R 1/04 |
| KR | 20130099781 A * | 9/2013 | | |
| KR | 101371982 B1 * | 3/2014 | | G01R 31/28 |
| KR | 101415984 B1 | 7/2014 | | |
| KR | 101561624 B1 * | 10/2015 | | G01R 31/2891 |
| KR | 20160146574 A * | 12/2016 | | G01R 27/2605 |
| KR | 20170095655 A * | 8/2017 | | G01R 31/28 |

OTHER PUBLICATIONS

Screen Captures from YouTube video clip entitled "6TL-33 IN-line test handler", 3 pages, uploaded Aug. 13, 2014, https://youtu.be/D2wJr_LXsGI?t=65 (Year: 2014) (Year: 2014).*
Office Action issued in the counterpart Chinese Patent Application No. 201910879640.7, dated Jun. 16, 2021 (19 pages).
Notice of Reasons for Refusal issued in corresponding Japanese Application No. 2018-234114 dated Apr. 12, 2022 (10 pages).
Office Action issued in counterpart Chinese Patent Application CN 201910879640.7 dated Jul. 13, 2022, with translation (20 pages).
Office Action issued in the counterpart Chinese Patent Application No. 201910879640.7, dated Feb. 21, 2022 (17 pages).
Office Action issued in counterpart German Patent Application No. DE 10 2019 124 931.7 dated May 4, 2023 (9 pages).

* cited by examiner

SENSOR TEST APPARATUS

TECHNICAL FIELD

The present invention relates to a sensor test apparatus which tests a sensor.

The present application claims priority from Japanese Patent Application No. 2018-234114 filed on Dec. 14, 2018. The contents described and/or illustrated in the documents relevant to the Japanese Patent Application No. 2018-234114 will be incorporated herein by reference as a part of the description and/or drawings of the present application.

BACKGROUND ART

In a test system which tests a packaged integrated circuit in which an integrated circuit chip die is packaged, the packaged integrated circuit is mounted on a socket, a signal indicative of the temperature of the packaged integrated circuit is obtained by a tester, and a temperature controller controls the temperature of an air flow directed to the packaged integrated circuit using cooling/heating means on the basis of the signal (for example, refer to Patent Document 1 (paragraphs [0033] to [0035] and FIG. 5)).

CITATION LIST

Patent Document

Patent Document 1: JP 2004-503924 A

SUMMARY OF THE INVENTION

Problem to be Solved by the Invention

When testing a packaged sensor, it is impossible to test the sensor with the above-described test system, because it is necessary to apply to the sensor under test a physical quantity to be detected by the sensor. In addition, in the above test system, a method of supplying a package integrated circuit to a socket is not considered.

An object of the present invention is to provide a sensor test apparatus capable of efficiently testing a sensor.

Means for Solving Problem

[1] A sensor test apparatus according to the present invention is a sensor test apparatus which tests a sensor which detects a first physical quantity, the sensor test apparatus comprising: an application unit comprising at least one application device including a socket to which the sensor is electrically connected, a first application part which applies the first physical quantity to the sensor, and a second application part which applies a second physical quantity to the sensor, the second physical quantity being different from the first physical quantity; a test unit which tests the sensor via the socket; and a conveying device which conveys the sensor into and out of the application unit.

[2] In the above invention, the second application part may be a temperature adjustment part which applies a thermal stress to the sensor to adjust the temperature of the sensor.

[3] In the above invention, the application device may include a pusher which contacts the sensor and presses the sensor against the socket, and the temperature adjustment part may be disposed in the pusher.

[4] In the above invention, the application unit may include a plurality of the application devices, and each of the application devices may include a pusher which contacts the sensor and presses the sensor against the socket, and a moving mechanism which moves the pusher relative to the socket.

[5] In the above invention, the first application part may be a pressure application part which applies a pressure to the sensor.

[6] In the above invention, the first application part may be a differential pressure application part which applies two types of pressure to the sensor.

[7] In the above invention, the first application part may be a magnetic field application part which applies a magnetic field to the sensor.

[8] In the above invention, the sensor test apparatus may include an apparatus main body housing the application unit, the test unit, and the conveying device, the apparatus main body may have a first opening through which the sensor is fed to a first position in the sensor test apparatus, and a second opening through which the sensor is ejected from a second position in the sensor test apparatus, and the conveying device may move the untested sensor from the first position to the application unit and move the tested sensor from the application unit to the second position.

[9] In the above invention, the sensor test apparatus may comprise: a preheat part which is disposed between the first position and the application unit and which applies a thermal stress to the sensor before being conveyed into the application unit; and a heat removal part which is disposed between the application unit and the second position and which removes a thermal stress from the sensor after being conveyed out of the application unit; and the conveying device may move the untested sensor from the first position to the preheat part, move the untested sensor from the preheat part to the application unit, move the tested sensor from the application unit to the heat removal part, and move the tested sensor from the heat removal part to the second position.

[10] In the above invention, in plan view, the first position, the preheat part, the application unit, the heat removal part, and the second position may be arranged in a substantially U-shape around the conveying device.

[11] In the above invention, the conveying device may be a horizontal articulated robot having first and second articulated arms sharing a first rotation axis, the first articulated arm may move the untested sensor from the first position to the preheat part and move the untested sensor from the preheat part to the application unit, and the second articulated arm may move the tested sensor from the application unit to the heat removal part and move the tested sensor from the heat removal part to the second position.

Effect of the Invention

In the present invention, since the first application part can apply the first physical quantity to the sensor which detects the first physical quantity, and the conveying device can convey the sensor into and out of the application unit including the socket and the first application part, it is possible to efficiently perform the test of the sensor.

BRIEF DESCRIPTION OF DRAWING(S)

Figure 16:
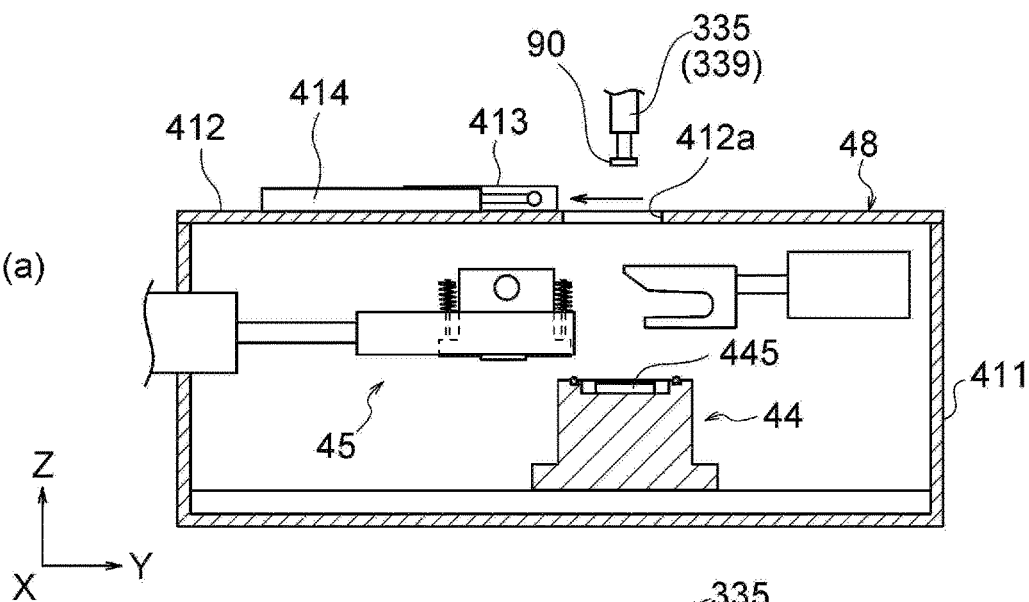
Figure 16:
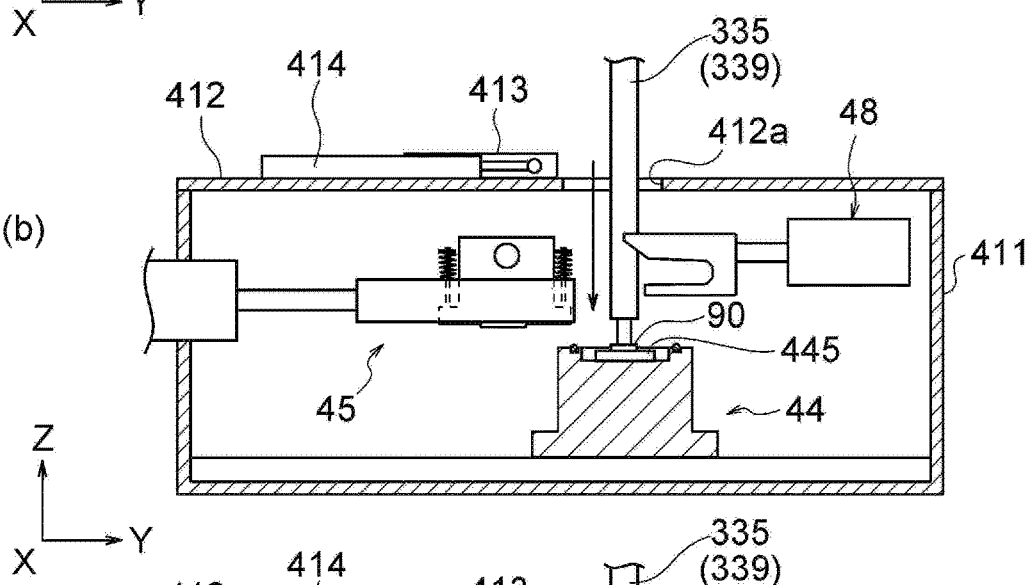
Figure 16:
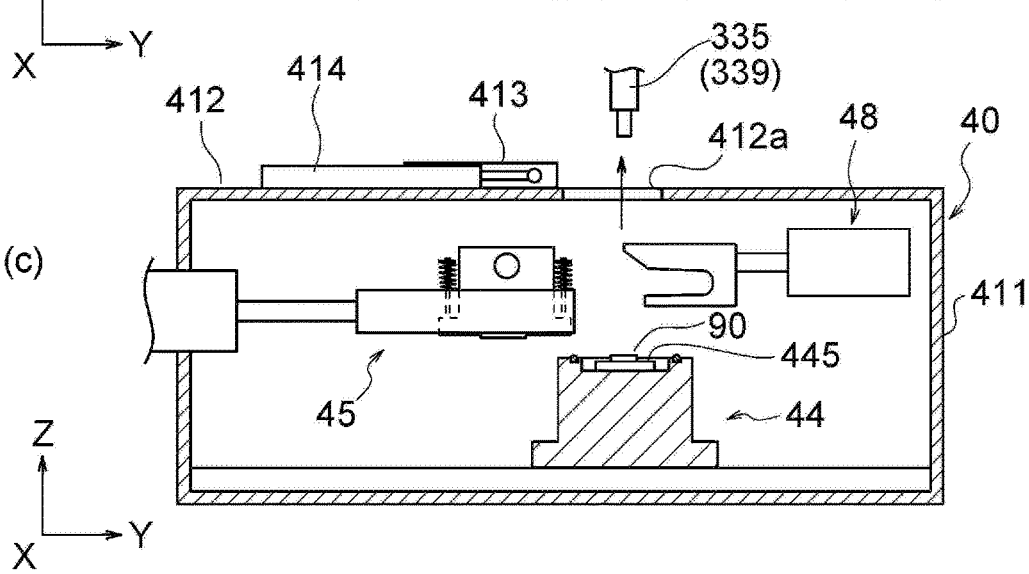

FIGS. 16(a) to 16(c) are cross-sectional views (No. 1 to No. 3) showing the operation of the application unit in the embodiment of the present invention.

Figure 17:
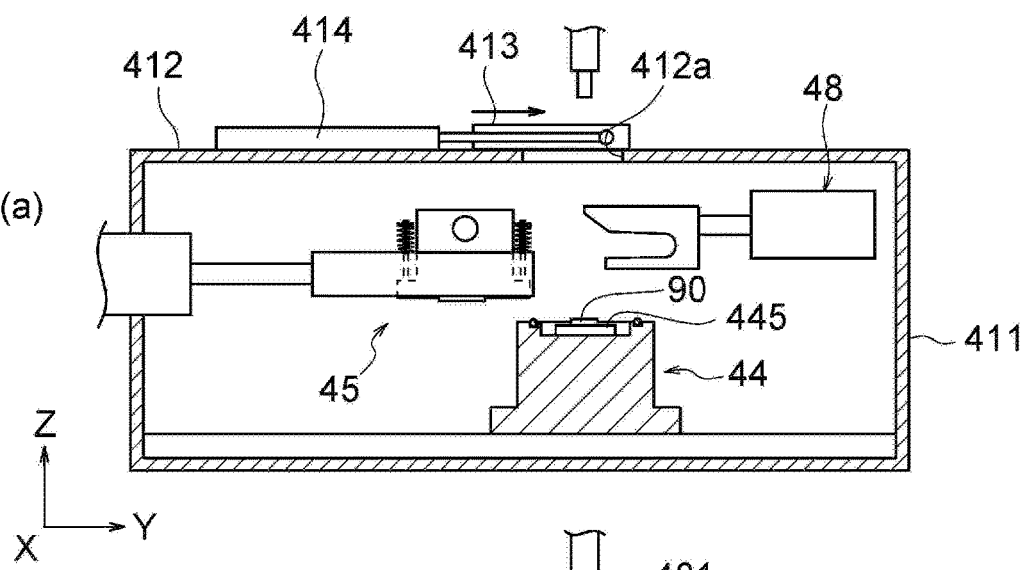
Figure 17:
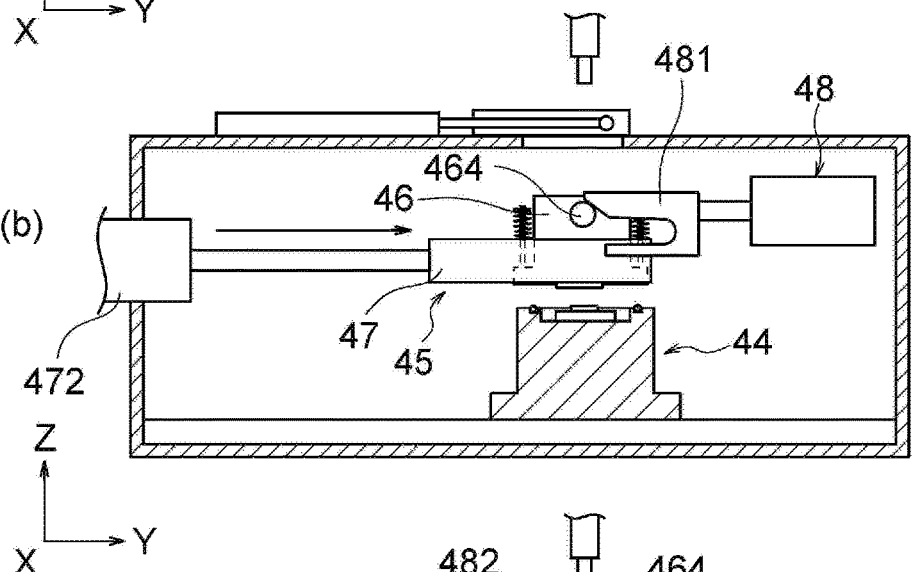
Figure 17:
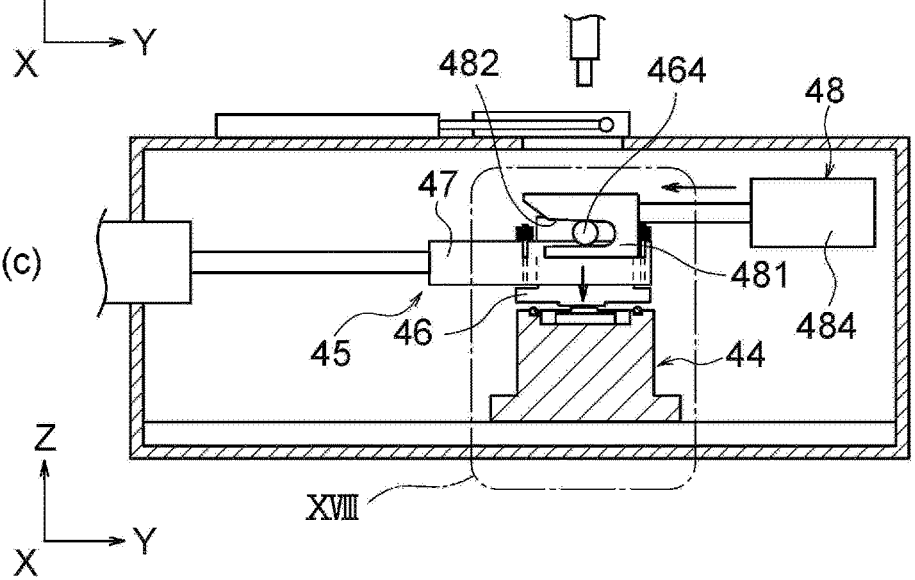

FIGS. 17(a) to 17(c) are cross-sectional views (No. 4 to No. 6) showing the operation of the application unit in the embodiment of the present invention.

Figure 18:
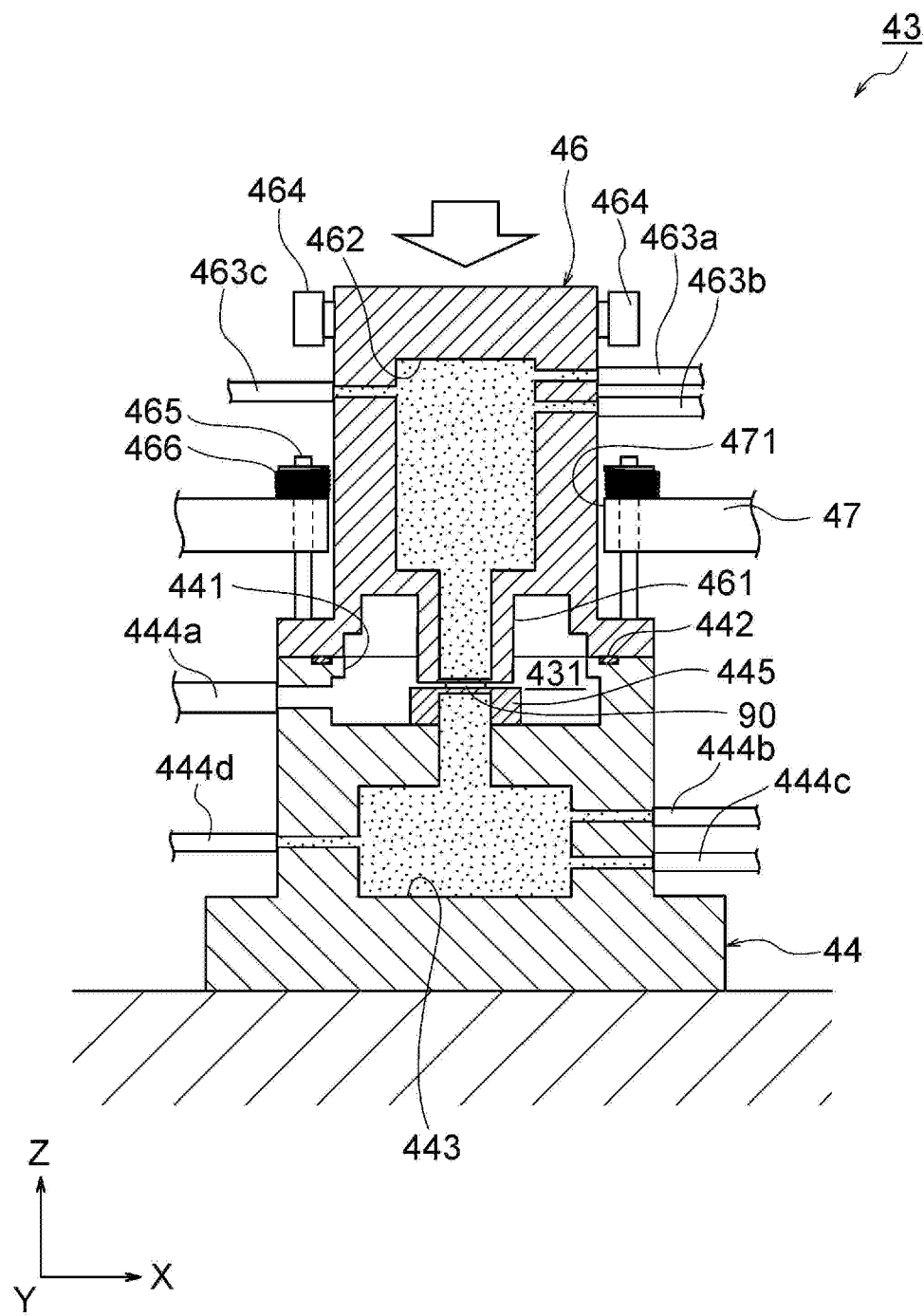

FIG. 18 is a cross-sectional view showing a pressure chamber in an embodiment of the present invention, and is an enlarged view of the XVIII portion of FIG. 17(c).

Figure 19:
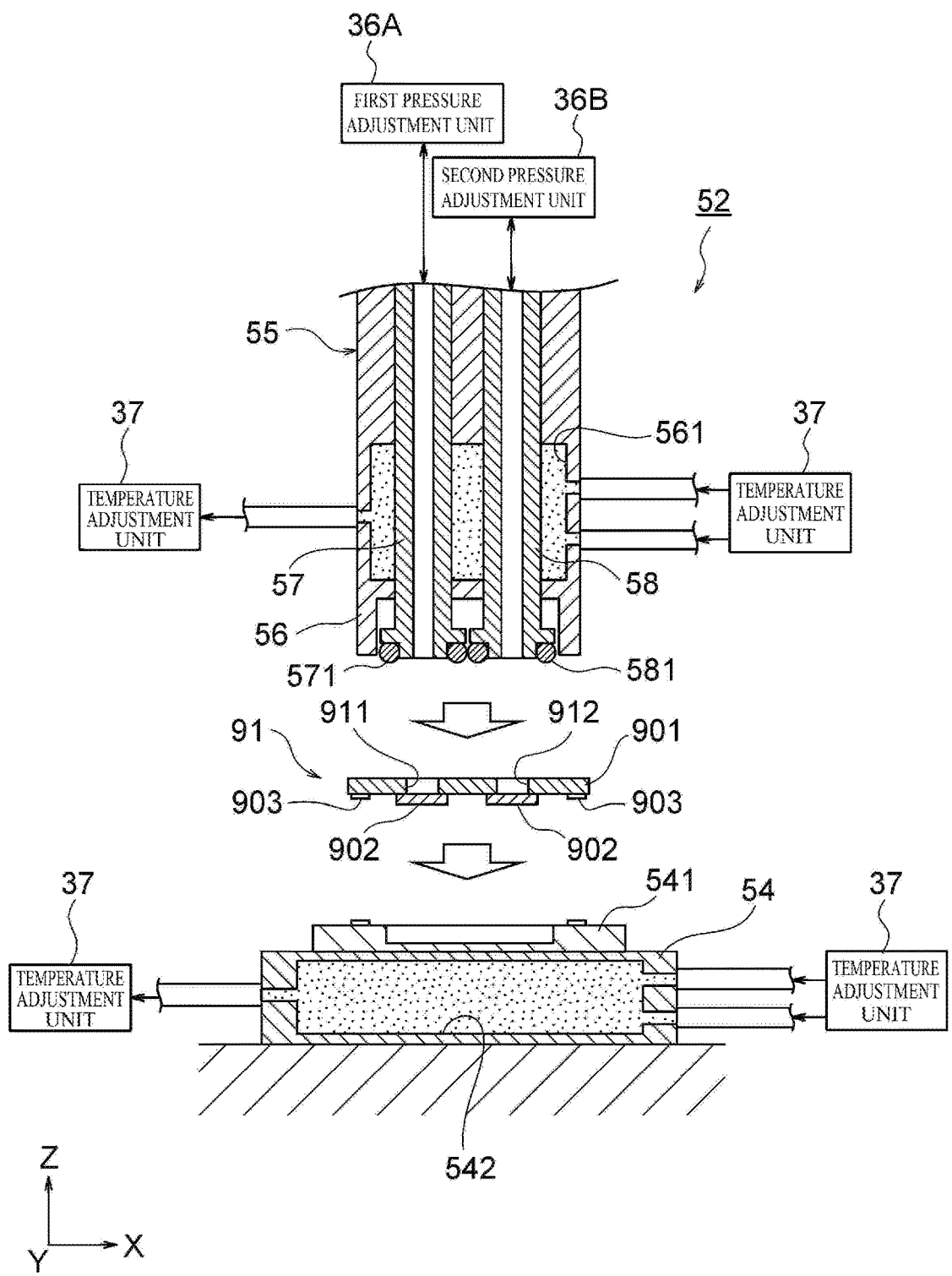

FIG. 19 is a diagram showing a first modification of the application device in an embodiment of the present invention, and is a cross-sectional view of the application device for the differential pressure sensor.

Figure 20:
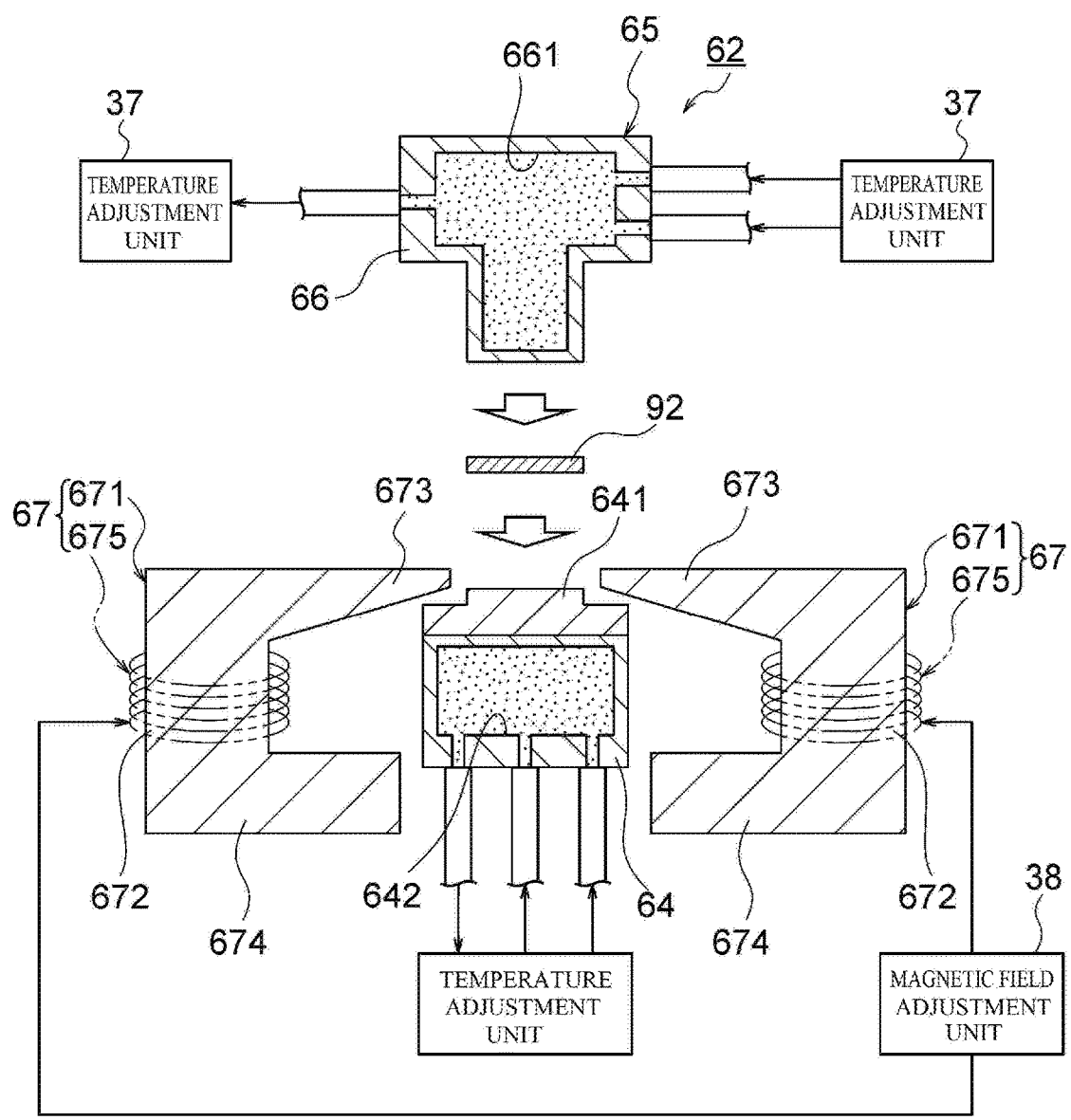

FIG. 20 is a diagram showing a second modification of the application device in an embodiment of the present invention, and is a cross-sectional view of the application device for a magnetic sensor.

MODE(S) FOR CARRYING OUT THE INVENTION

Hereinafter, an embodiment of the present invention will be described with reference to the drawings.

Figure 1:
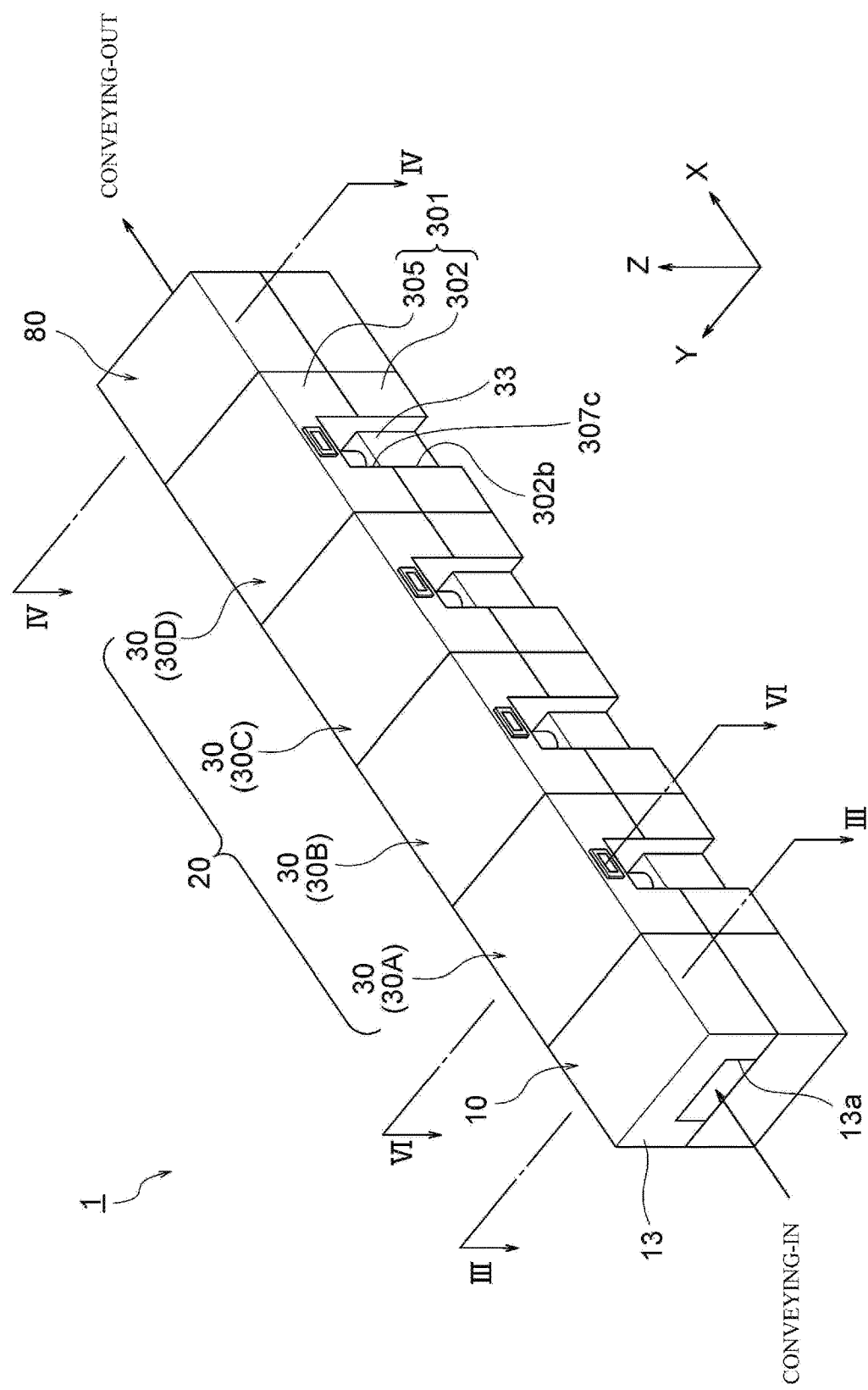
FIG. 1 is a perspective view showing a sensor test system in an embodiment of the present invention.
Figure 2:
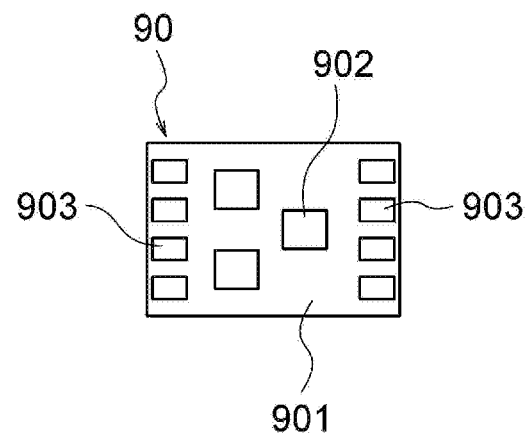
FIG. 2(a) is a plan view showing the pressure sensor that is the test object of the sensor test system in the embodiment of the present invention.
FIG. 2(b) is a plan view showing a modification of the pressure sensor that is the test object of the sensor test system in the embodiment of the present invention.
Figure 2:
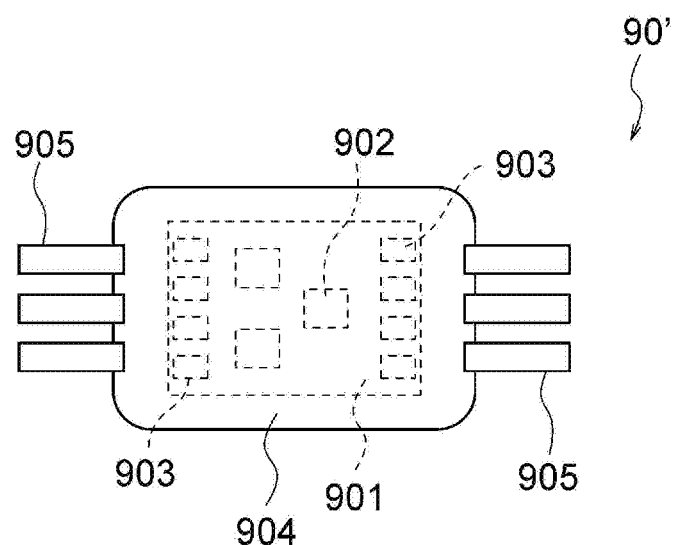

FIG. 1 is a perspective view showing a sensor test line in the present embodiment, FIG. 2(a) is a plan view showing a pressure sensor that is the test object of the sensor test system in the present embodiment, and FIG. 2(b) is a plan view showing a modification of the pressure sensor that is the test object of the sensor test system in the present embodiment.

As shown in FIG. 1, the sensor test system 1 in the present embodiment is a sensor test line including a test apparatus group 20 configured by connecting a plurality of (four in this example) test cells 30 (30A to 30D) for testing a sensor 90. The test cell 30 in the present embodiment corresponds to an example of the "sensor test apparatus" in the present invention. The number of the test cells 30 constituting the test apparatus group 20 is not particularly limited, and can be set in accordance with the number of types of tests performed by the sensor test system 1 and the like.

The sensor 90 which is a test object of the sensor test system 1 is a pressure sensor that detects (measures) pressure and outputs an electrical signal according to the detection result (measurement result). As shown in FIG. 2(a), the sensor 90 is a sensor device of a type in which an individualized sensor chip (die) 902 is mounted on a wiring board 901. Contactors of a socket 445 of the later described application unit 40 contact terminals 903 provided on the wiring board 901.

As shown in FIG. 2(b), the sensor 90' which is a test object of the sensor test system 1 may be a sensor device of a type in which a wiring board 901 on which a sensor chip 902 is mounted is packaged with a resin material and leads 905 protrude from the package 904. In this case, the contactors of socket 445 contact the leads 905.

The test object of the sensor test system 1 may be a sensor other than a pressure sensor. For example, a differential pressure sensor or a magnetic sensor may be a test object of the sensor test system 1. Alternatively, a sensor for detecting a physical quantity other than pressure or magnetism may be a test object of the sensor test system 1.

Each of the test cells 30 is a device that determines whether or not the sensor 90 is defective on the basis of an electric signal output from the sensor 90 in a state where the temperature of the sensor 90 is adjusted to a predetermined temperature and a predetermined pressure is applied to the sensor 90. Although not particularly limited, in the sensor test system 1, it is possible to perform multiple type of tests (four types in this example) with respect to one sensor 90 by passing the sensor 90 through a plurality of test cells 30A to 30D.

As shown in FIG. 1, the sensor test system 1 includes a loader 10 that carries an untested sensor 90 into the test apparatus group 20, and an unloader 80 that carries the tested sensor 90 out of the test apparatus group 20, and can automatically carry the sensor 90 into/out of the test apparatus group 20.

Figure 3:
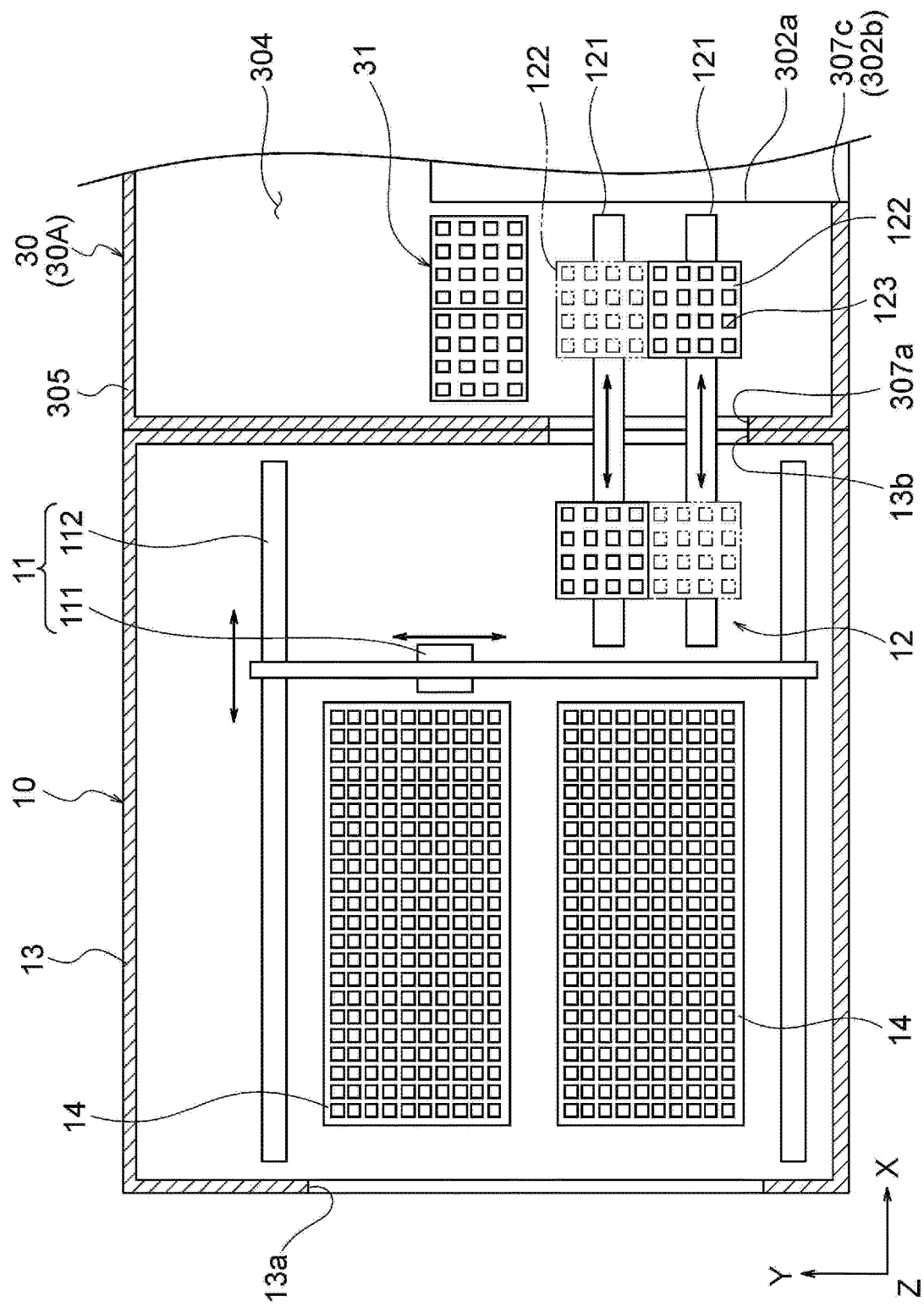
FIG. 3 is a diagram showing the internal layout of a loader in an embodiment of the present invention, and is a cross-sectional view taken along the line in FIG. 1.

FIG. 3 is a diagram showing an internal layout of the loader in the present embodiment, and is a cross-sectional view taken along the line of FIG. 1.

The loader 10 in the present embodiment is a loading device for carrying an untested sensor 90 into the test apparatus group 20, and is connected to a test cell 30A located at the leading end (left end in FIG. 1) of the test apparatus group 20. As shown in FIG. 3, the loader 10 includes a transfer device 11 and a moving device 12.

The transfer device 11 is a pick-and-place device that conveys the sensor 90, and includes an suction head 111 that can hold the sensor 90 by suction and can move up and down in the Z direction, and a rail 112 that moves the suction head 111 on the XY plane. The moving device 12 includes a rail 121 provided along the X direction, and a plate 122 reciprocally movable on the rail 121. On the upper surface of the plate 122, a plurality of concave accommodating portions 123 capable of accommodating the sensors 90 are formed.

A part of the moving device 12 and the transfer device 11 are accommodated in a cover 13 of the loader 10, and two openings 13a and 13b are formed in the cover 13. The remainder of the moving device 12 extends into the test cell 30A through one opening 13b.

The tray 14 is carried into the lower side of the transfer device 11 through the other opening 13a. Transfer device 11 picks up the sensor 90 from this tray 14 and places it in the accommodation portion 123 of the plate 122 located in the loader 10. The moving device 12 moves the plate 122 into the test cell 30A through the opening 13b, and carries the untested sensor 90 into the test cell 30A.

The configuration of the loader 10 is not particularly limited to the above-described configuration. For example, instead of the pick-and-place device, an articulated robot arm may be used as the transfer device 11. Alternatively, a parts feeder may be used instead of the transfer device 11. The plurality of trays 14 may be carried into the loader 10 in a state of being accommodated in a magazine.

Figure 4:
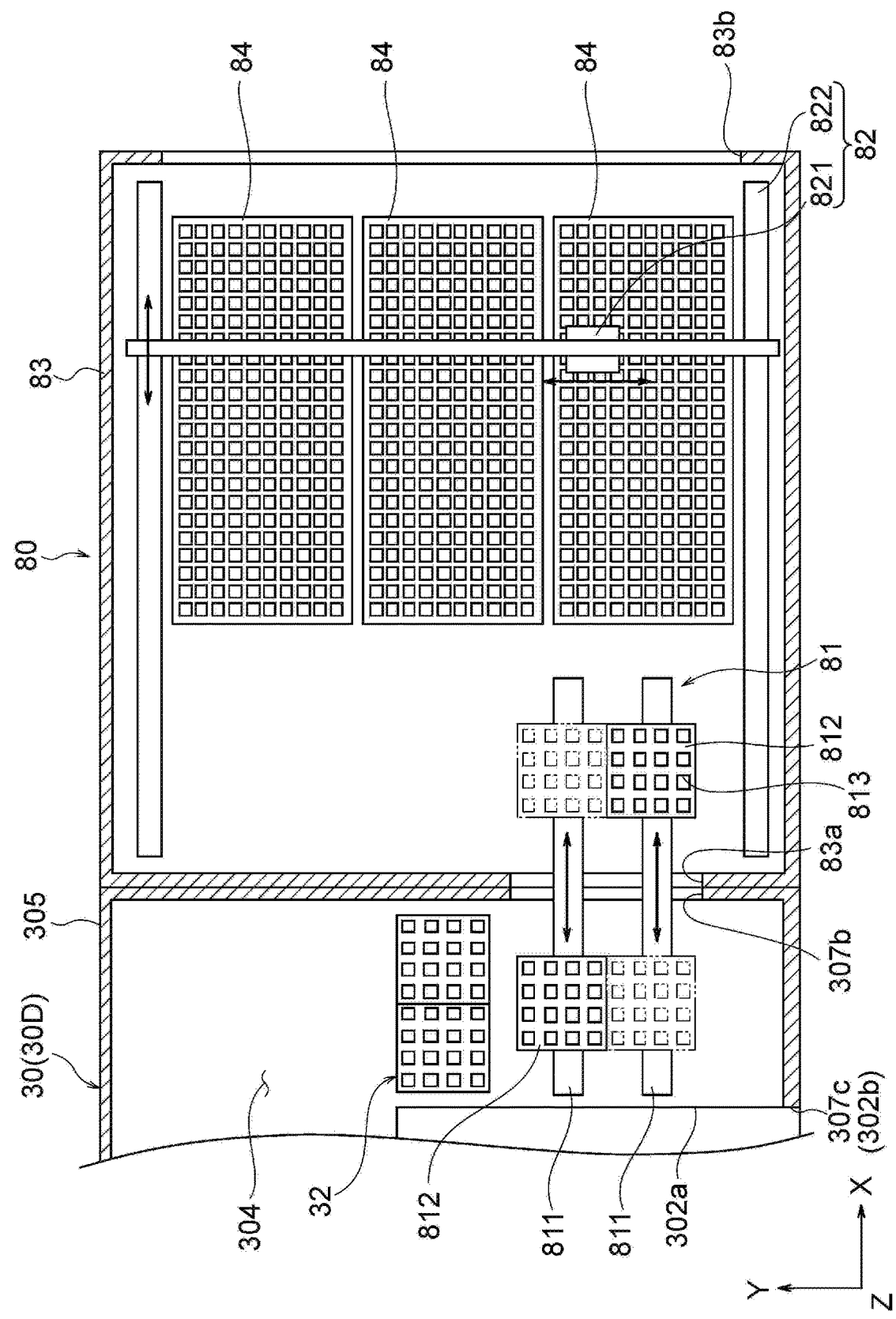
FIG. 4 is a diagram showing the internal layout of an unloader in an embodiment of the present invention, and is a cross-sectional view taken along the IV-IV line of FIG. 1.

FIG. 4 is a diagram showing an internal layout of the unloader in the present embodiment, and is a cross-sectional view taken along the Iv-Iv line of FIG. 1.

The unloader 80 in the present embodiment is a discharge device for discharging the tested sensor 90 from the test apparatus group 20, and is connected to the test cell 30D located at the rear end (right end in FIG. 1) of the test apparatus group 20. As shown in FIG. 4, the unloader 80 includes a moving device 81 and a transfer device 82.

The moving device 81 is the same device as the moving device 12 of the loader 10 described above, and includes a rail 811 and a plate 812, and a plurality of accommodation portions 813 are formed on the upper surface of the plate 812. The transfer device 82 is the same device as the transfer device 11 of the loader 10 described above, and is a pick-and-place device including a suction head 821 and a rail 822.

A part of the moving device 81 and the transfer device 82 are accommodated in a cover 83 of the unloader 80, and two openings 83a and 83b are formed in the cover 83. The remainder of the transfer device 81 extends into the test cell 30D through one opening 83a.

The moving device 81 moves the plate 812 from the test cell 30D into the unloader 80 and ejects the tested sensor 90 from the test cell 30D. Then, the transfer device 82 picks up the sensor 90 from the plate 812 located in the unloader 80, and places it on the trays 84 located below the transfer device 82. At this time, the transfer device 82 may place the sensor 90 on the tray 84 while classifying the sensors 90 on the basis of the test results of the respective test cells 30. The tray 84 is carried out of the unloader 80 through the other opening 83b of the cover 83.

The configuration of the unloader 80 is not particularly limited to the above-described configuration. For example, an articulated robot arm may be used as the transfer device 82 instead of the pick-and-place device. Alternatively, a parts feeder may be used instead of the transfer device 82. The plurality of trays 84 may be carried out of the unloader 80 in a state of being accommodated in a magazine.

Figure 5:
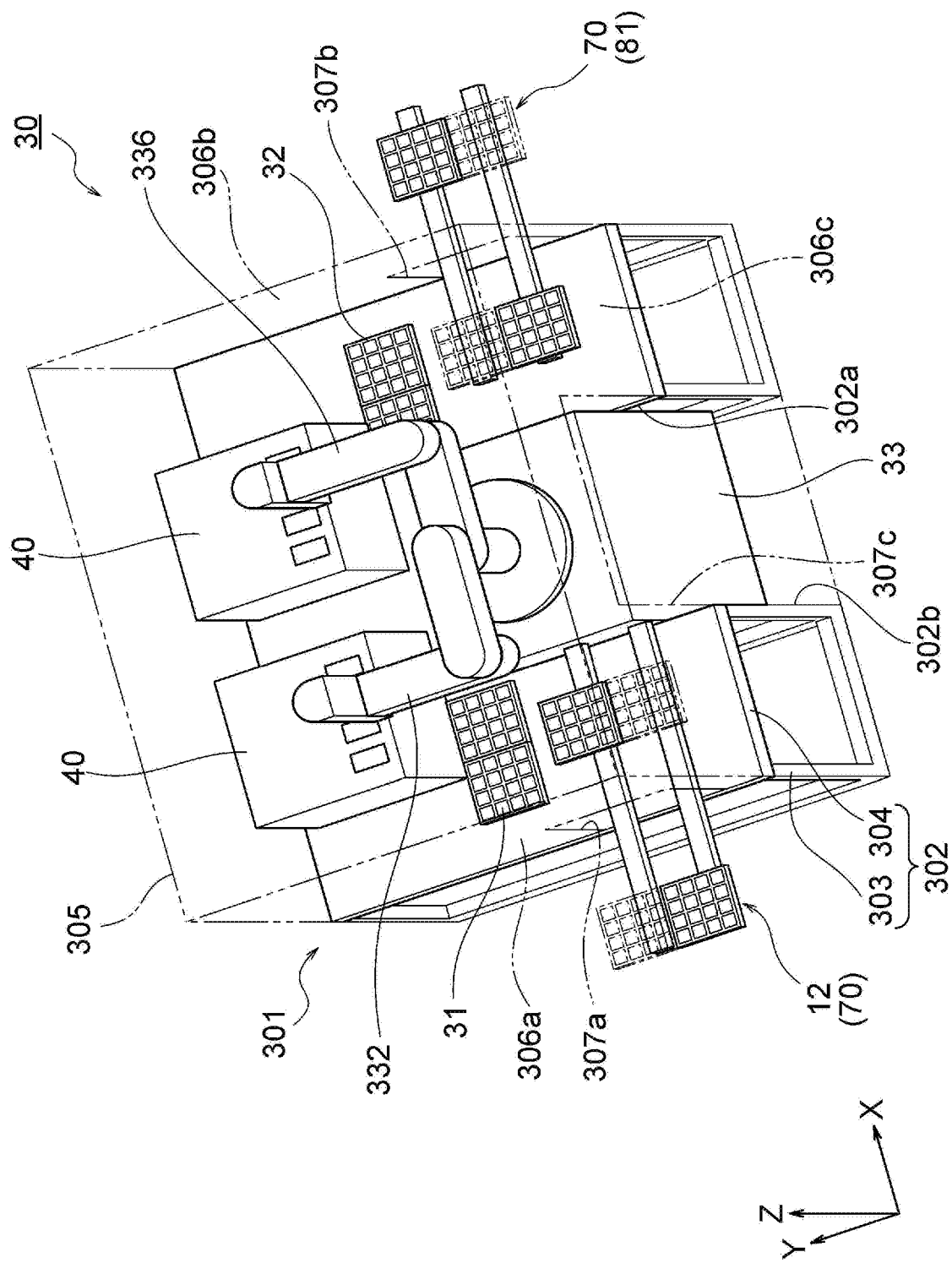
FIG. 5 is a perspective view showing a test cell in an embodiment of the present invention.
Figure 6:
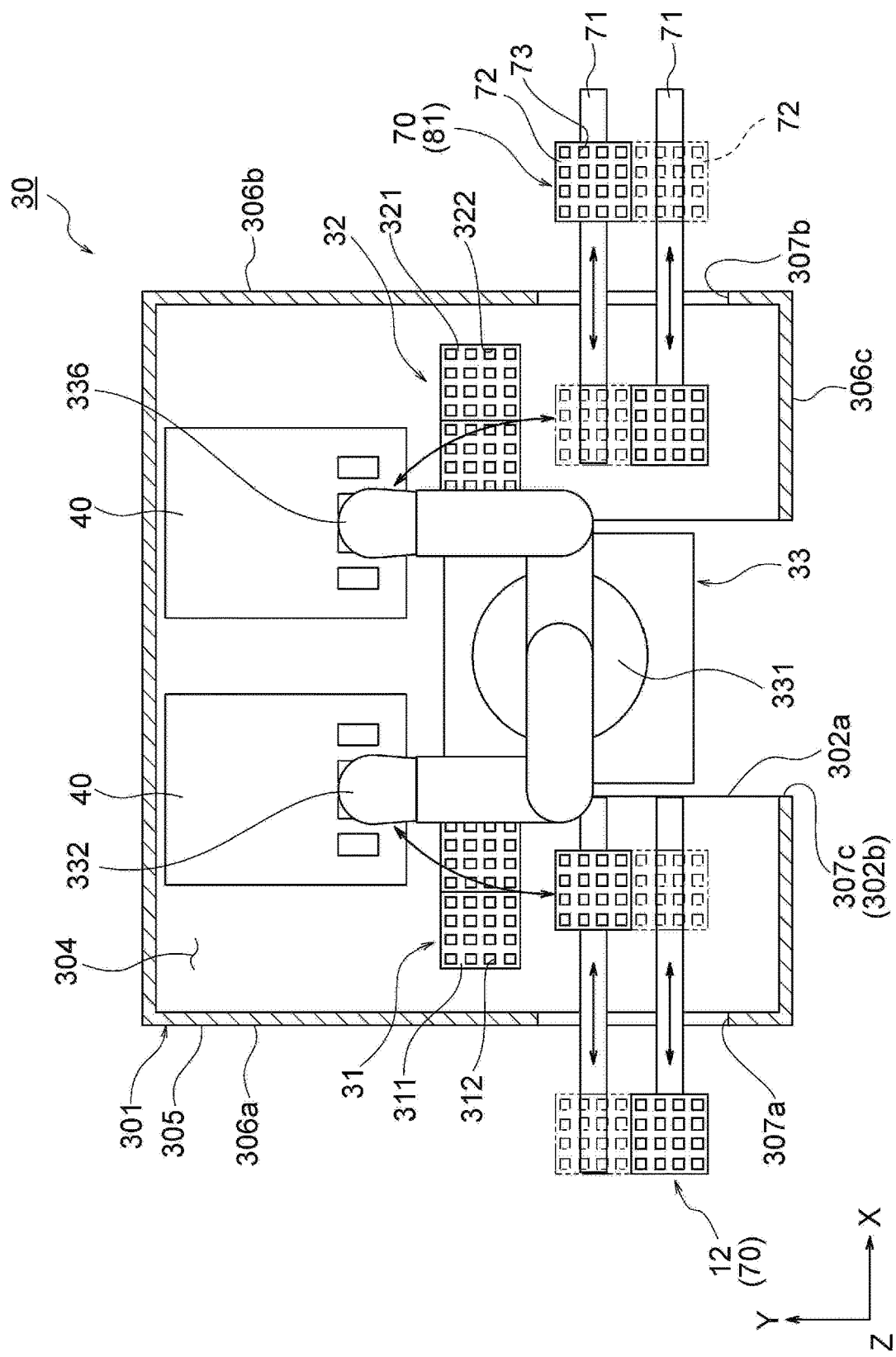
FIG. 6 is a diagram showing the internal layout of a test cell in an embodiment of the present invention, and is a cross-sectional view taken along the VI-VI line of FIG. 1.
Figure 7:
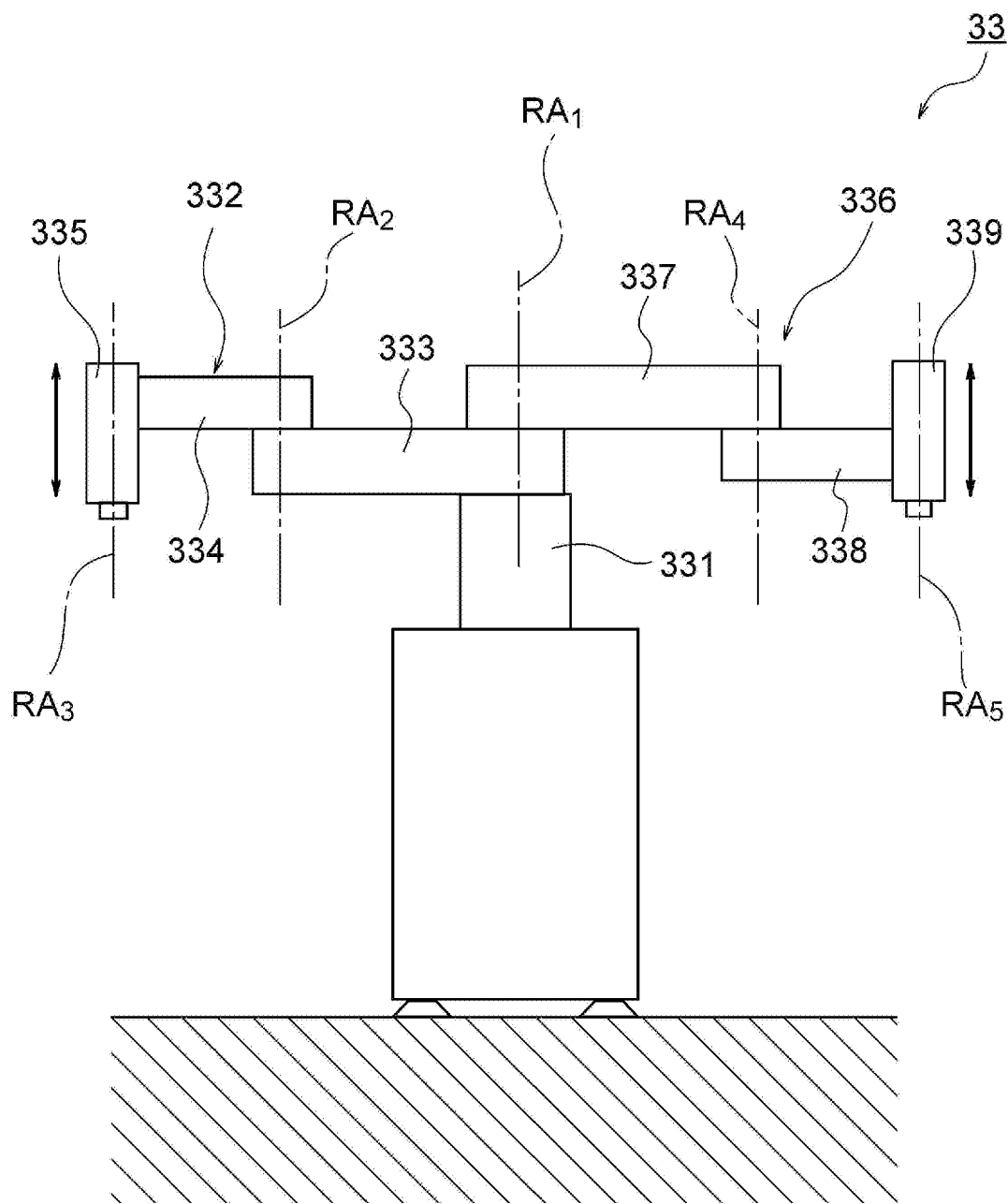
FIG. 7 is a front view showing a conveying robot in an embodiment of the present invention.
Figure 8:
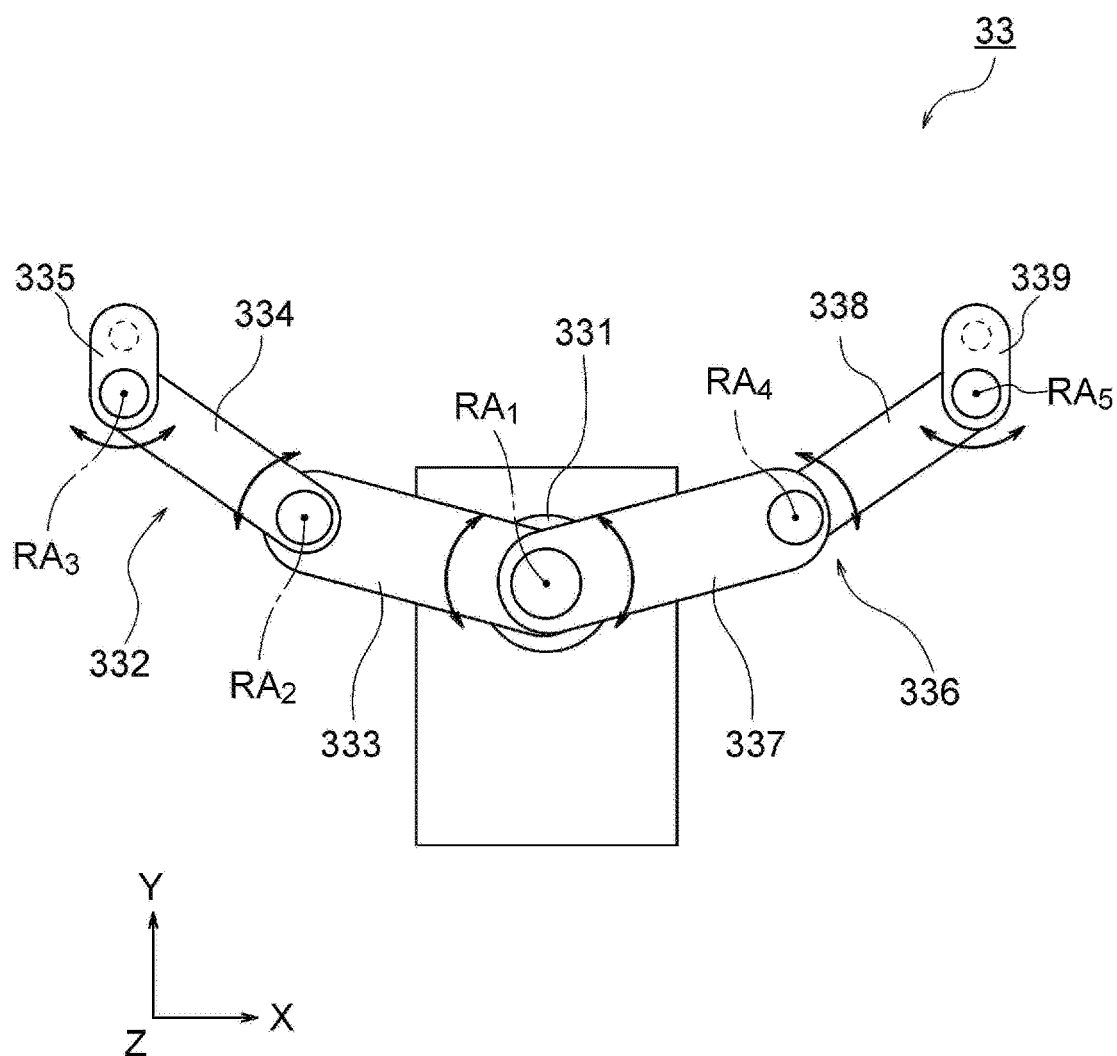
FIG. 8 is a plan view showing a conveying robot in an embodiment of the present invention.

FIG. 5 is a perspective view showing a test cell in the present embodiment, FIG. 6 is a view showing a layout inside the test cell in the present embodiment, and FIGS. 7 and 8 are a front view and a plan view showing a conveying robot in the present embodiment.

The test apparatus group 20 in the present embodiment includes a plurality of test cells 30 that respectively execute a test of the sensor 90, and a moving device 70 that transfers the sensor 90 between mutually adjacent test cells 30.

As shown in FIG. 6, the moving device 70 is the same device as the moving device 12 of the loader 10 described above, and includes a rail 71 and a plate 72, and a plurality of accommodating portions 73 are formed on the upper surface of the plate 72.

As shown in FIGS. 5 and 6, each test cell 30 includes a preheat part 31, a plurality of (two in this example) application units 40, a heat removal part 32, and a conveying robot 33. Since the test cell 30 includes a plurality of application units 40, throughput in the test cell 30 can be improved.

The number of application units 40 included in the test cell 30 is not particularly limited, and the test cell 30 may include only one application unit 40, or may include three or more application units 40. The test cell 30 may not include the preheat part 31 and the heat removal part 32.

The test cell 30 includes an apparatus main body 301 that accommodates a preheat part 31, application units 40, a heat removal part 32 and the conveying robot 33. The apparatus main body 301 includes a base 302 and a cover 305.

The base 302 includes a frame 303 and a base plate 304 supported by the frame 303. The base 302 has a concave portion 302a recessed in the +Y direction in plan view, and has a substantially U-shaped planar shape. The base 302 has an opening 302b formed by the recess 302a, and the opening 302b opens in the −Y direction.

The cover 305 is provided on the base 302 and has a substantially cubic shape including the entire surface of the base plate 304 including the concave portion 302a. Openings 307a and 307b are formed in the X direction side surfaces 306a and 306b of the cover 305 respectively. An opening 307c is formed in the −Y direction side surface 306c of the cover 305. The opening 307c is located above the opening 302b of the base 302, and the openings 302b and 307c substantially coincide with each other in the Z direction. The opening 307a in the present embodiment corresponds to an example of the "first opening" in the present invention, and the opening 307b in the present embodiment corresponds to an example of the "second opening" in the present invention.

The preheat part 31, the application units 40, and the heat removal part 32 are provided on the base plate 304 of the base 302, and are disposed in the apparatus main body 301. The conveying robot 33 also enters the concave portion 302a of the base 302 via the openings 302b and 307c of the apparatus main body 301, and is disposed in the apparatus main body 301. The conveying robot 33 can be moved into and out of the apparatus main body 301 through the openings 302b and 307c, and the test cell 30 is excellent in the maintainability.

In the case where the test cell 30 is the test cell 30A at the leading end (left end in FIG. 1), the moving device 12 of the loader 10 described above enters the test cell 30A through the opening 307a. A part of the moving device 70 is located on the base plate 304 of the test cell 30A, and the remainder of the moving device 70 extends toward the rear end side test cell 30B through the opening 307b.

In this case, the portion of the moving device 12 located on the base plate 304 of the test cell 30A corresponds to an example of the "first position" in the present invention. The portion of the moving device 70 located on the base plate 304 of the test cell 30A corresponds to an example of the "second position" in the present invention.

On the other hand, in the case where the test cell 30 is the test cell 30D at the rear end (right end in FIG. 1), the moving device 70 protruding from the leading end side test cell 30C enters the test cell 30D through the opening 307a. The moving device 81 of the unloader 80 enters the test cell 30D through the opening 307b.

In this case, the portion of the moving device 70 located on the base plate 304 of the test cell 30D corresponds to an example of the "first position" in the present invention. The portion of the moving device 81 located on the base plate 304 of the test cell 30D corresponds to an example of the "second position" in the present invention.

Further, in the case where the test cell 30 is an intermediate test cell 30B (test cell 30C) other than the test cells 30A and 30D, the moving device 70 protruding from the leading end side test cell 30A (test cell 30B) enters the test cell 30B (test cell 30C) through the opening 307a. A part of another moving device 70 is located on the base plate 304 of the test cell 30B (test cell 30C), and the remainder of the moving device 70 extends toward the rear end side test cell 30C (test cell 30D) through the opening 307b.

In this case, the portion of the leading end side moving device 70 located on the base plate 304 of the test cell 30B (test cell 30C) corresponds to an example of the "first position" in the present invention. The portion of the rear end side moving device 70 located on the base plate 304 of the test cell 30B (test cell 30C) corresponds to an example of the "second position" in the present invention.

In plan view, the moving device 12 (moving device 70), the preheat part 31, the application units 40, the heat removal part 32, and the moving device 70 (moving device 81) are arranged in a substantially U-shape so as to surround the conveying robot 33.

More specifically, the preheat part 31 is disposed between the moving device 12 (moving device 70) that is in the apparatus main body 301 and the application unit 40. The heat removal part 32 is disposed between the application unit 40 and the moving device 70 (moving device 81) that is in the test cell 30. The leading end side moving device 12 (moving device 70) and the rear end side moving device 70 (moving device 81) face each other via the concave portion 302a of the base 302. Similarly, the preheat part 31 and the heat removal part 32 also face each other via the concave portion 302a. By employing such a substantially U-shaped layout, space saving of the test cell 30 can be achieved.

The layout in the apparatus main body 301 is not limited to a substantially U-shape. For example, the moving device 12 (moving device 70), the preheat part 31, the application unit 40, the heat removal part 32, and the moving device 70 (moving device 81) may be arranged linearly in the apparatus main body 301.

The preheat part 31 includes a plate 311 having a plurality of recessed accommodation portions 312 capable of accommodating the sensors 90 respectively. The plate 311 is connected to a heating/cooling device (not shown), and the temperature of the sensor 90 before being supplied to the application unit 40 can be brought close to a predetermined temperature in advance. Thereby, it is possible to shorten the time required for the temperature of the sensor 90 to reach the predetermined temperature in the application unit 40.

The heat removal part 32 also includes a plate 321 having a plurality of recessed accommodation portions 322 capable of accommodating the sensors 90. The plate 321 is connected to a heating/cooling device (not shown), and the temperature of the sensor 90 after being discharged from the application unit 40 can be brought close to a normal temperature. Thereby, it is possible to shorten the heat removal period of the sensor 90 after the test in the application unit 40, and to restrain condensation from occurring on the sensor 90 after the test.

The configuration of the preheat part 31 is not particularly limited to the above. For example, the preheat part 31 may blow warm air or cold air to the untested sensor 90 to heat/cool the sensor 90. Similarly, the configuration of the heat removal part 32 is not particularly limited to the above. For example, the heat removal part 32 may blow warm air or cold air to the tested sensor 90 to heat/cool the sensor 90.

As shown in FIGS. 7 and 8, the conveying robot 33 is a double-armed scalar robot having two articulated arms 332 and 336. The conveying robot 33 carries the untested sensor 90 into the application unit 40, and carries the tested sensor 90 out of the application unit 40. The conveying robot 33 in the present embodiment corresponds to an example of the "conveying device" in the present invention.

The conveying robot 33 includes a base portion 331, a first articulated arm 332, and a second articulated arm 336. The first and second articulated arms 332 and 336 are supported by the base portion 331, and are rotatable about the first rotation shaft $RA_1$. That is, the first and second articulated arms 332 and 336 share the first rotation shaft $RA_1$.

The first articulated arm 332 includes a first arm 333, a second arm 334, and a first suction head 335. The first arm 333 is supported by the base portion 331 and is rotatable about the first rotation shaft $RA_1$ as described above. The second arm 334 is supported by the first arm 333 and is rotatable about the second rotation shaft $RA_2$. The first suction head 335 is supported by the second arm 334 and is rotatable about the third rotation shaft $RA_3$. The first suction head 335 is held by the second arm 334 so as to be able to move up and down in the Z direction, and has a suction pad capable of holding the sensor 90 by suction.

Similarly to the first articulated arm 331, the second articulated arm 336 also includes a third arm 337, a fourth arm 338, and a second suction head 339. The third arm 337 is supported by the base portion 331 and is rotatable about the first rotation shaft $RA_1$ as described above. The fourth arm 338 is supported by the third arm 337 and is rotatable about the fourth rotation shaft $RA_4$. The second suction head 339 is supported by the fourth arm 338 and is rotatable about the fifth rotation shaft $RA_5$. The second suction head 339 is held by the fourth arm 338 so as to be able to move up and down in the Z direction, and has a suction pad capable of holding the sensor 90 by suction.

In the present embodiment, space saving of the test cell 30 can be achieved by using such a double-armed scalar robot as the conveying robot 33. The configuration of the first and second articulated arms 331 and 336 (e.g., the degree of freedom and the length of each arm) is not particularly limited to the above. The configuration of the first articulated arm 331 and the configuration of the second articulated arm 336 may be different from each other. Alternatively, another type of robot other than the double-armed scalar robot may be used as the conveying robot 33. Alternatively, instead of the conveying robot 33, another conveying device such as a pick-and-place device may be used.

As shown in FIGS. 5 and 6, when an untested sensor 90 is carried into the test cell 30 by the moving device 12 (moving device 70) from the loader 10 (previous test cell 30), the conveying robot 33 moves the sensor 90 from the moving device 12 (moving device 70) to the preheat part 31, and further moves the sensor 90 from the preheat part 31 to the application unit 40. When the test of the sensor 90 is completed in the application unit 40, the conveying robot 33 moves the tested sensor 90 from the application unit 40 to the heat removal part 32, and further moves the sensor 90 from the heat removal part 32 to the moving device 70 (moving device 81). The moving device 70 (moving device 81) moves the sensor 90 to the next test cell 30 (unloader 80).

At this time, in the present embodiment, the first articulated arm 332 of the conveying robot 33 is in charge of supplying the sensor 90 to the application unit 40. On the other hand, the second articulated arm 336 is in charge of discharging the sensor 90 from the application unit 40.

Specifically, the first articulated arm 332 is in charge of the movement from the moving device 12 (moving device 70) to the preheat part 31 and the movement from the preheat part 31 to the application unit 40. On the other hand, the second articulated arm 336 is in charge of the movement from the application unit 40 to the heat removal part 32 and the movement from the heat removal part 32 to the moving device 70 (moving device 81). The first articulated arm 332 supplies the untested sensors 90 to both application units 40, and the second articulated arm 336 discharges the tested sensors 90 from both application units 40.

Figure 9:
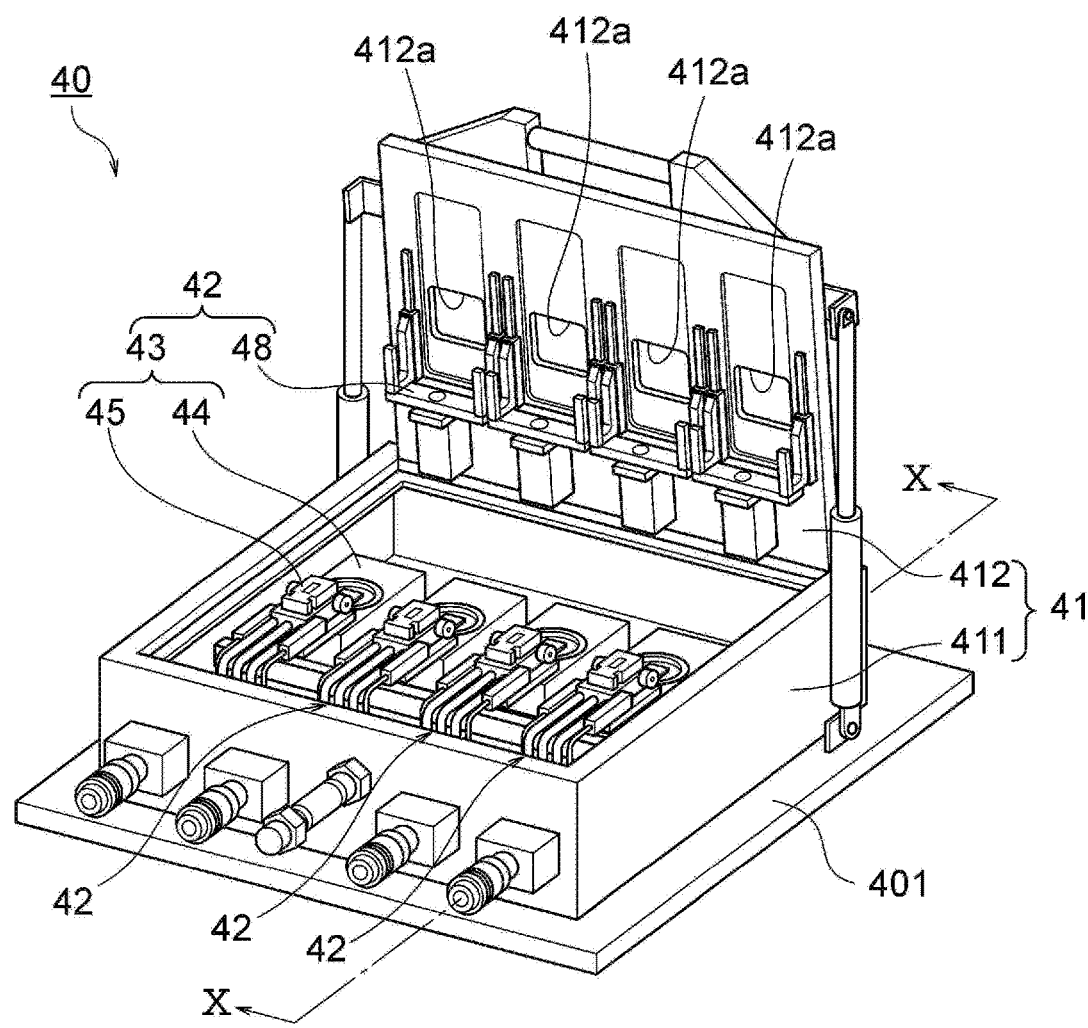
FIG. 9 is a perspective view showing an application unit in an embodiment of the present invention.
Figure 10:
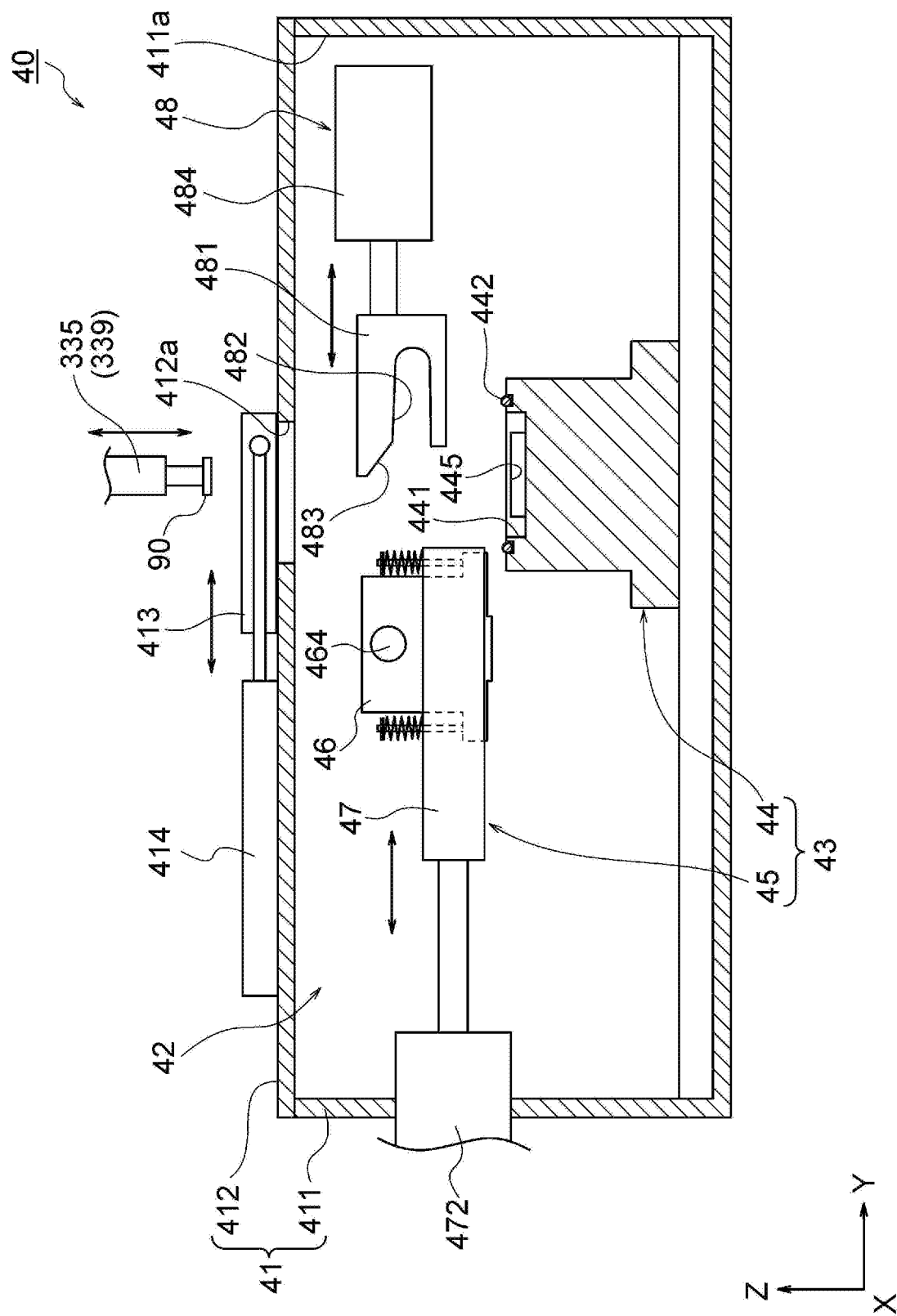
FIG. 10 is a diagram showing an application unit in an embodiment of the present invention, and is a cross-sectional view taken along line X-X of FIG. 9.
Figure 11:
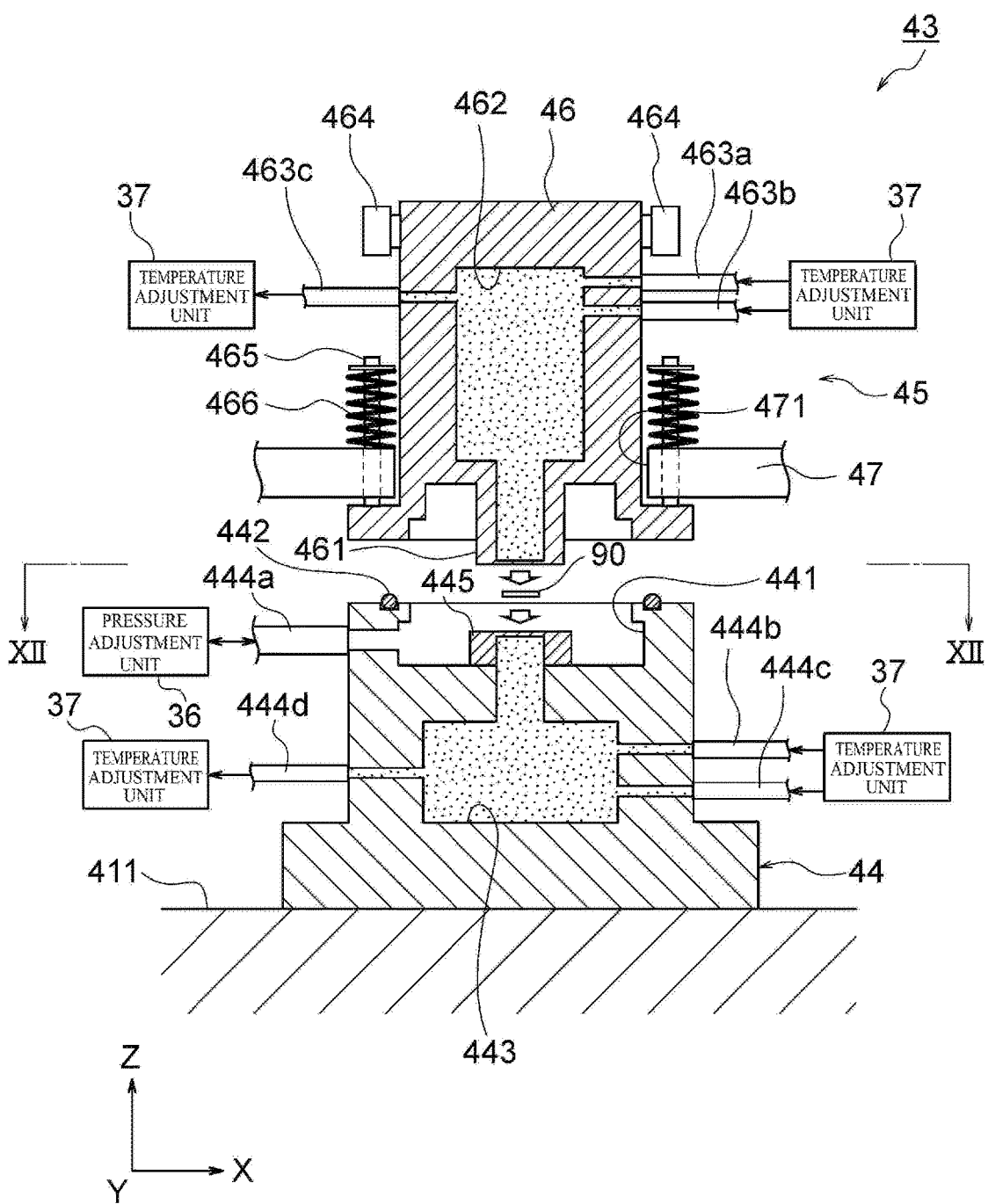
FIG. 11 is a cross-sectional view showing a pressure chamber in an embodiment of the present invention.
Figure 12:
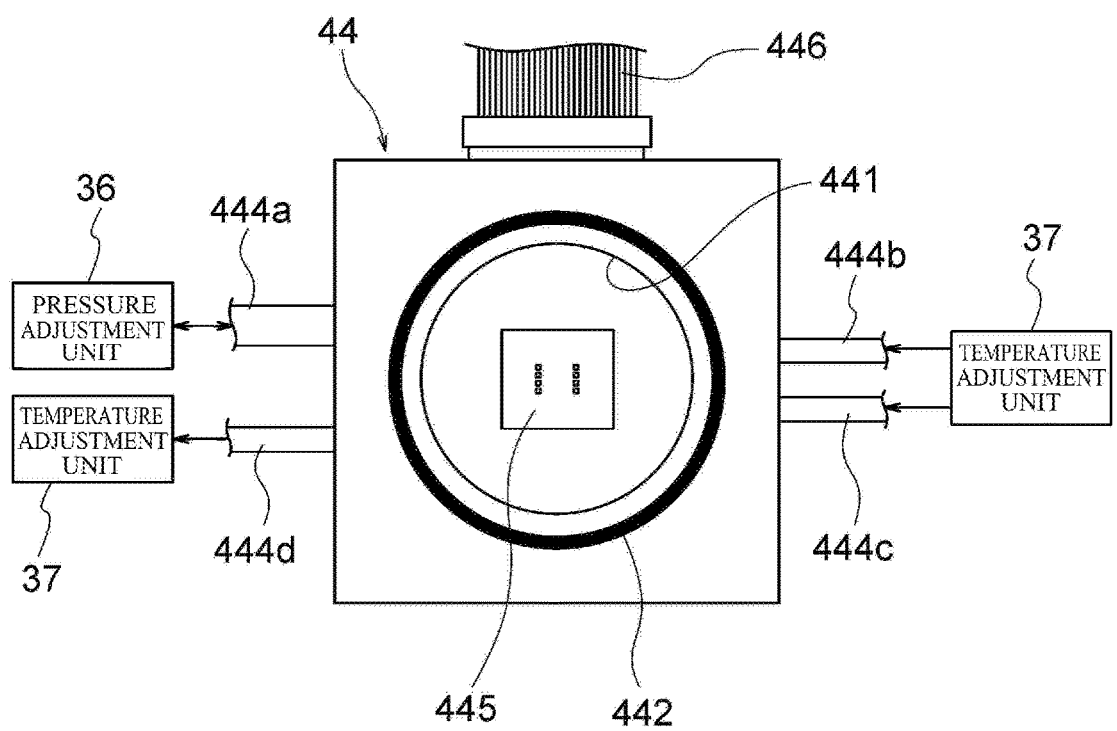
FIG. 12 is a plan view showing the base portion of the pressure chamber in the embodiment of the present invention, and is a view seen in the XII arrow direction of FIG. 11.

FIGS. 9 and 10 are a perspective view and a cross-sectional view showing an application unit in the present embodiment, FIG. 11 is a cross-sectional view showing a pressure chamber in the present embodiment, and FIG. 12 is a plan view showing a base portion of the pressure chamber in the present embodiment.

As shown in FIGS. 9 and 10, the application unit 40 includes a dry chamber 41 and a plurality of (four in this example) application devices 42. In the present embodiment, the two application units 40 included in the respective test cells 30 have the same structure, but the present invention is not particularly limited thereto.

In the present embodiment, four application devices 42 are accommodated in the dry chamber 41, and one application device 42 corresponds to one sensor 90. Therefore, in the application unit 40 of the present embodiment, it is possible to simultaneously test the four sensors 90. The number of the application devices 42 included in the application unit 40 is not particularly limited, and can be arbitrarily determined in accordance with the throughput and the like required for the test cell 20.

The dry chamber 41 includes a box-shaped housing 411 having an opening 411a, and a lid 412 covering the opening 441a. Dry air having a low dew point temperature is filled in the dry chamber 41 to suppress the occurrence of condensation on the sensor 90.

Four windows 412a are formed in the lid 412 so as to correspond to the four application devices 42 respectively. Four shutters 413 is provided in the lid 412 so as to correspond to the four windows 412a. The shutter 413 is reciprocally movable in the Y direction by the actuator 414, and the window 412a of the lid 412 is opened and closed by the shutter 413 when the sensor 90 is carried in and out of the application unit 40. As a specific example of the actuator 414, for example, an air cylinder can be exemplified.

The configuration of the application unit is not particularly limited to the above. For example, the application unit may not comprise a dry chamber. In this case, the application unit may be configured by simply providing a plurality of application devices 42 on one support plate 401.

Each of the application devices 42 is a unit that applies a thermal stress to the sensor 90 supplied by the conveying robot 33 and applies a pressure to the sensor 90. The application device 42 includes a pressure chamber 43 and a pressing mechanism 48. In the present embodiment, the four application devices 42 included in the respective application units 40 have the same structure, but the present invention is not particularly limited thereto.

As shown in FIGS. 11 and 12, the pressure chamber 43 has a base portion 44 and a head portion 45. The base portion 44 is fixed to the bottom surface of the housing 411 so as to face the window 412a of the lid 412 of the dry chamber 41. A circular concave portion 441 is opened on the upper surface of the base portion 44, and an O-ring 442 is provided so as to surround the opening of the concave portion 441. A pipe 444a is connected to a side surface of the base portion 44. The pipe 444a communicates with the inside of the concave portion 441 and is connected to the pressure adjustment unit 36 (to be described later).

A socket 445 is provided at the center of the inside of the concave portion 441. Although not shown in particular, the socket 445 has contactors that contact the terminals 903 of the sensor 90. Examples of such contactors include pogo pins, anisotropic conductive rubber, and the like. A cable 446 is connected to a side surface of the base portion 44. The socket 445 is electrically connected to the test unit 35 (to be described later) via the cable 446.

A heat sink 443 is formed inside the base portion 44. Although not shown in particular, the heat sink 443 has a bellows-shaped flow path formed inside the base portion 44, fins protruding from the inner wall of the base portion 44, or the like, and can efficiently exchange heat with the refrigerant/hot medium supplied from the temperature adjusting unit 37 (to be described later).

The heat sink 443 is provided directly below the socket 445, and can heat/cool the sensor 90 through the socket 445. Pipes 444b to 444d are connected to the side surface of the base portion 44. These pipes 444b to 444d communicate with the heat sink 443 and are connected to the temperature adjustment unit 37.

The head portion 45 of the pressure chamber 43 includes a pusher 46 and a holding plate 47. As shown in FIG. 10, the head portion 45 is provided in the dry chamber 41 so as to be reciprocally movable in the Y direction by an actuator 472 (to be described later), and can reciprocate between a position above the base portion 44 (refer to FIG. 17(*b*)) and a position retreated from above the base portion 44 (see FIG. 16(*a*)).

As shown in FIG. 11, the pusher 46 has a convex portion 461 protruding downward, and the convex portion 461 contacts the sensor 90 to press the sensor 90 against the socket 445.

A heat sink 462 is provided inside the pusher 46. Similarly to the heat sink 443 of the base portion 44 described above, the heat sink 462 has a bellows-shaped flow path formed inside the pusher 46, fins protruding from the inner wall of the pusher 46, or the like, and can efficiently exchange heat with the refrigerant/hot medium supplied from the temperature adjusting unit 37.

The heat sink 462 is formed also inside the convex portion 461, and can heat/cool the sensor 90. Pipes 463a to 463c are connected to the side surface of the head portion 45. These pipes 463a to 463c communicate with the heat sink 462 and are connected to the temperature adjusting device 37.

In the present embodiment, both the base portion 44 and the head portion 45 have the heat sinks 443 and 462, however this is not particularly limited. For example, one of the base portion 44 or the head portion 45 may have a heat sink, and the other of the head portion 45 or the base portion 44 may have a temperature adjusting means other than the heat sink. As an example of the temperature adjusting means other than the heat sink, for example, a heater, a Peltier element, or the like can be exemplified. Alternatively, only one of the base portion 44 or the head portion 45 may have a temperature adjusting means, and the other of the head portion 45 or the base portion 44 may not have a temperature adjusting means.

A pair of cam followers 464 are rotatably mounted on the upper portion of the pusher 46. As the cam follower 464 rolls along the cam groove 482 of the pressing mechanism 48 (to be described later), the pusher 46 is lowered.

Further, the pusher 46 is inserted into an opening 471 of the holding plate 47, and is movably held by the holding plate 47 via a stopper 465 and a coil spring 466. The stopper 465 is inserted into the through hole of the holding plate 47 and fixed to the pusher 46. The coil spring 466 is interposed between the stopper 465 and the holding plate 47 in a compressed state, and the pusher 46 is urged upward by the coil spring 466.

As shown in FIG. 10, an actuator 472 fixed to the dry chamber 41 is connected to the holding plate 47. The actuator 472 allows the head portion 45 to reciprocate in the Y direction. As a specific example of the actuator 472, for example, an air cylinder can be exemplified.

The pressing mechanism 48 is provided in the dry chamber 41 so as to face the head portion 45 with the base portion 44 interposed therebetween. The pressing mechanism 48 includes a cam plate 481 and an actuator 484.

A cam groove 482 into which the cam follower 464 of the pusher 46 is inserted is formed in the cam plate 481. As the cam follower 464 rolls along the inclined surface 483 of the cam groove 482, the pusher 46 descends relative to the holding plate 47.

An actuator 484 fixed to the dry chamber 41 is connected to the cam plate 481. The actuator 484 allows the cam plate 481 to reciprocate in the Y direction. As a specific example of the actuator 484, for example, an air cylinder can be exemplified.

The pressure chamber 43 in the present embodiment corresponds to an example of the "pressure application part" in the present invention, the heat sink 462 formed in the head portion 45 in the present embodiment corresponds to an example of the "temperature adjustment part" in the present invention, and the actuator 472 and the pressing mechanism 48 in the present embodiment correspond to an example of the "movement mechanism" in the present invention.

The configuration of the application device is not particularly limited to the above configuration as long as the application device includes a socket to which the sensor is electrically connected, a mechanism for applying a thermal stress to the sensor, and a mechanism for applying pressure to the sensor.

The configuration of the moving mechanism for moving the pusher 46 relative to the socket 445 is not particularly limited to the above. For example, instead of the actuator 472 and the pressing mechanism 48, a ball screw and a motor may be used to configure the moving mechanism. Alternatively, a pick-and-place device, a robot having an articulated arm, or the like may be used as a moving mechanism.

Figure 13:
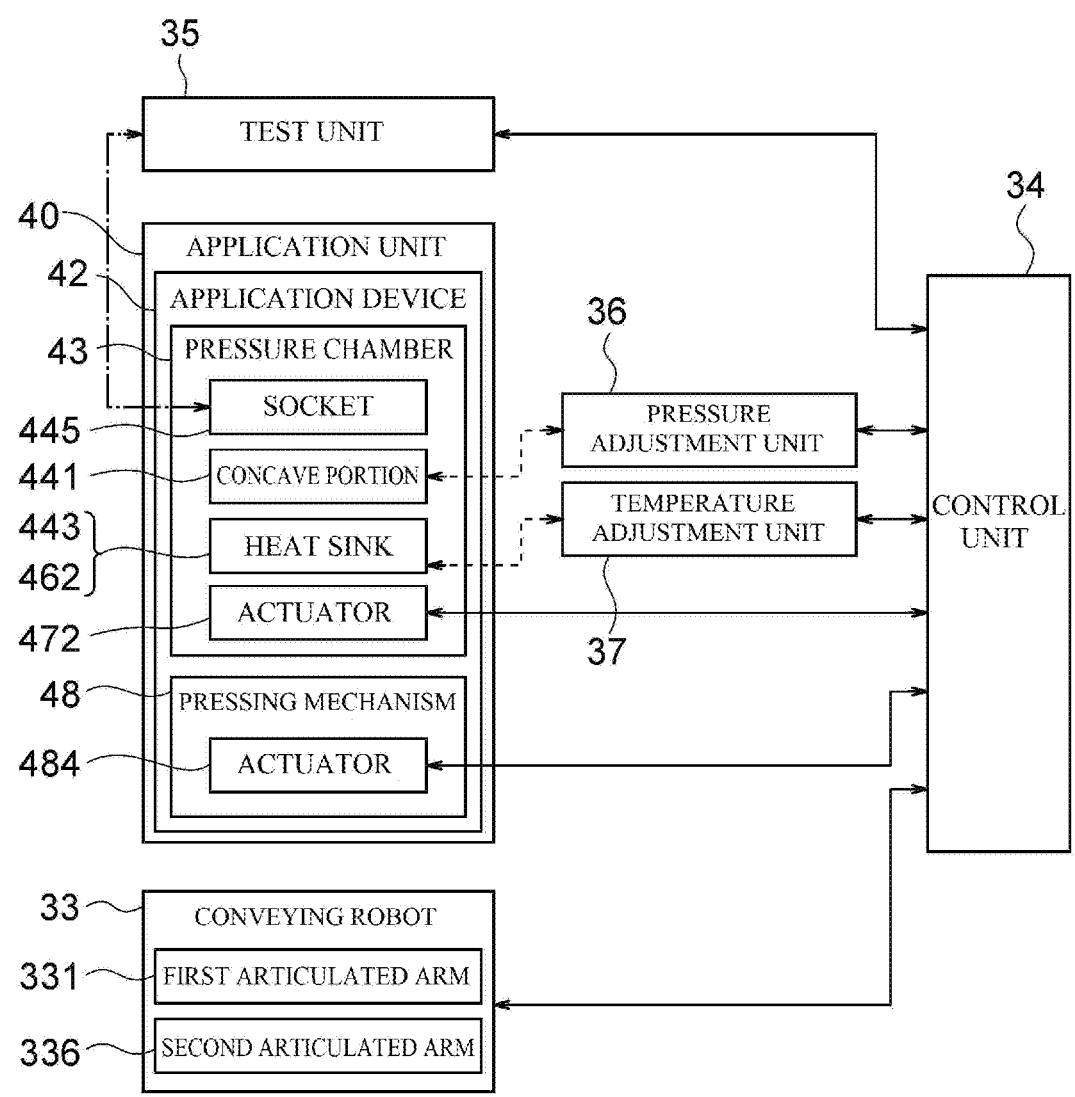
FIG. 13 is a block diagram showing a control system of a test cell in an embodiment of the present invention.
Figure 14:
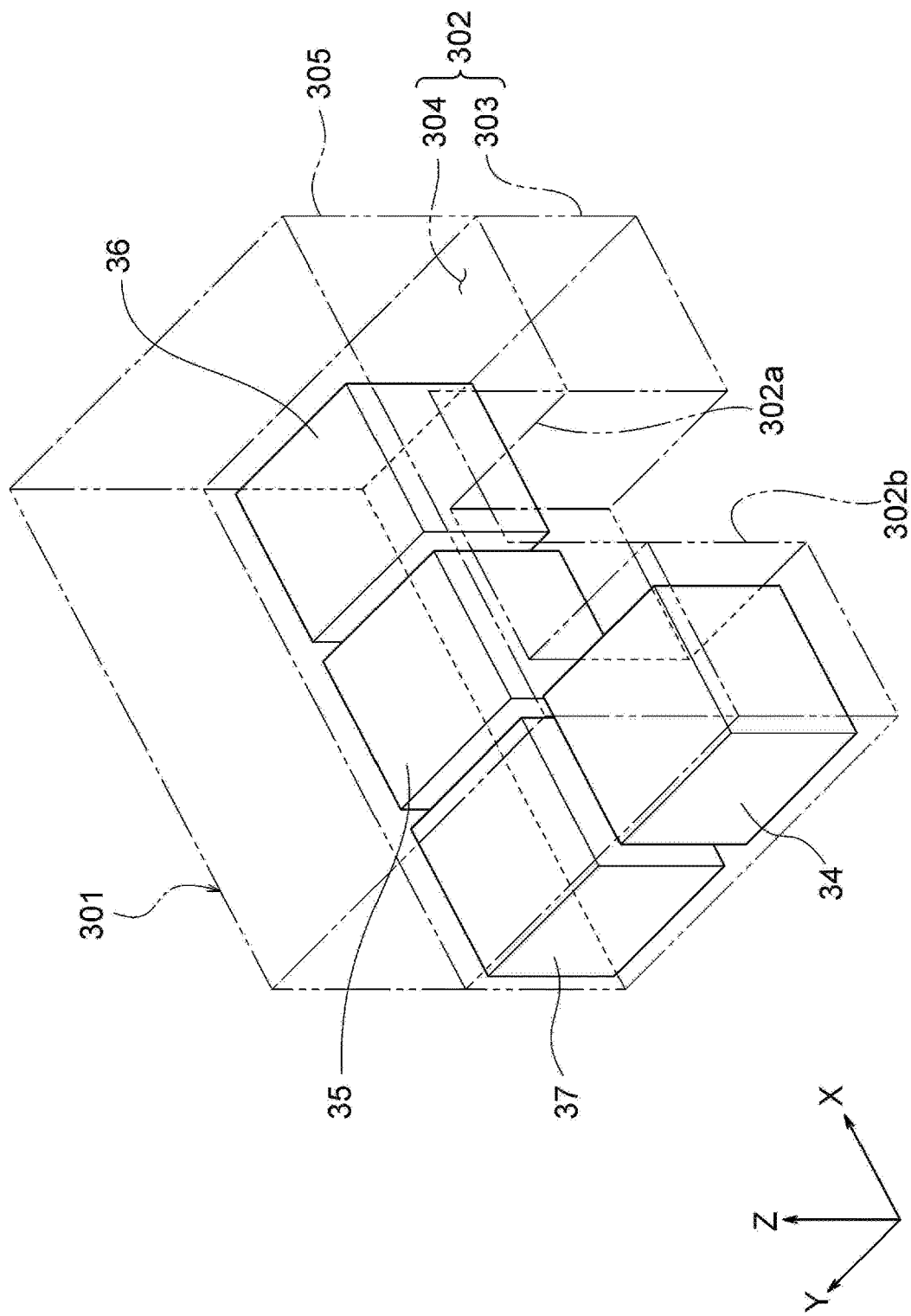
FIG. 14 is a perspective view showing the inside of the base of the test cell in the embodiment of the present invention.
Figure 15:
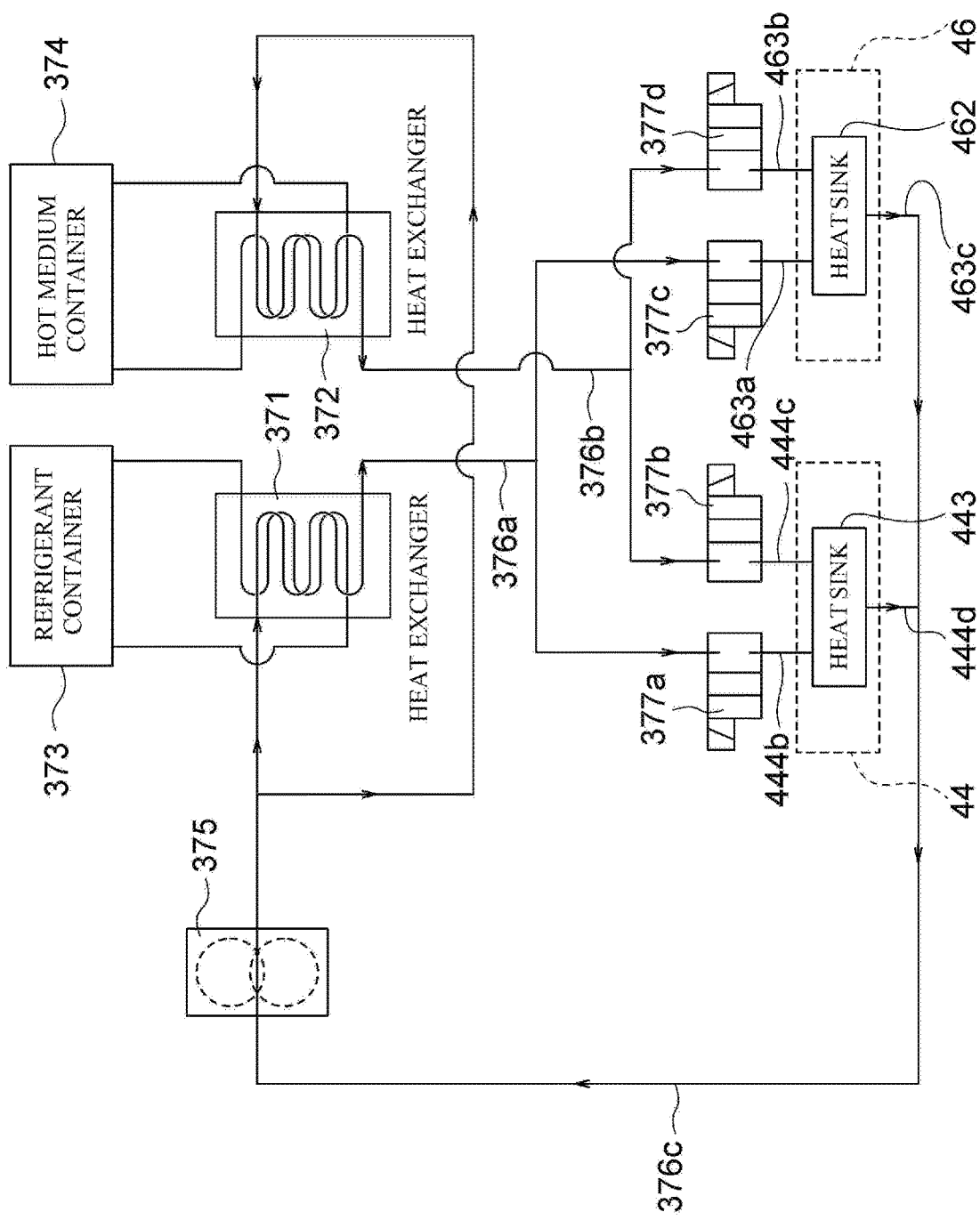
FIG. 15 is a piping circuit diagram of a temperature adjustment unit in an embodiment of the present invention.

FIG. 13 is a block diagram showing the control system of the test cell in the present embodiment, FIG. 14 is a perspective view showing the inside of the base of the test cell in the present embodiment, and FIG. 15 is a piping circuit diagram of the temperature adjustment unit in the present embodiment.

As shown in FIG. 13, each test cell 30 includes a control unit 34, a test unit 35, a pressure adjustment unit 36, and a temperature adjustment unit 37.

As shown in FIG. 14, the control unit 34, the test unit 35, the pressure adjustment unit 36, and the temperature adjustment unit 37 are installed inside a frame 303 of a base 302 of an apparatus main body 301. In the present embodiment, the test unit 35 is disposed directly under the application unit 40 from the viewpoint of improving the test accuracy, but the present invention is not particularly limited thereto. For example, the pressure adjustment unit 36 may be arranged directly below the application unit 40, or the temperature adjustment unit 37 may be arranged directly below the application unit 40.

The control unit 34 includes, for example, a computer, and manages the controls in the test cell 30. Specifically, as shown in FIG. 13, the control unit 34 controls the test unit 35, the pressure adjustment unit 36 and the temperature adjustment unit 37, and also controls the above-described conveying robot 33 and the actuators 472, 484 of the application unit 40.

The test unit 35 includes, for example, a computer, a circuit board for testing, or the like, and is electrically connected to a socket 445 provided in each pressure chamber 43 of the application unit 40. The test unit 35 supplies electric power to the sensor 90 and acquires an electric signal output from the sensor 90 in a state where a predetermined pressure is applied to the sensor 90 by the pressure chamber 43, and determines whether the sensor 90 is a non-defective product or a defective product on the basis of the electric signal. The test unit 35 may acquire the characteristic of the output of the sensor 90 with respect to the actually applied pressure value on the basis of the electric signal output from the sensor 90.

The pressure adjustment unit 36 is connected to the concave portion 441 of the base portion 44 via the pipe 444a described above. The pressure adjustment unit 36 includes, for example, a pressurizing device, a depressurizing device, and a pressure controller. The pressurizing device pressurizes the atmosphere in the sealed space 431 by supplying compressed air into the sealed space 431 (to be described later) of the pressure chamber 43. The depressurizing device is a device for depressurizing the atmosphere in the sealed space 431, and as a specific example, an ejector or a vacuum pump can be exemplified. The pressure controller is provided between the pressurizing device and the sealed space 431 and between the depressurizing device and the sealed space 431, is a device for adjusting the pressurizing amount by the pressurizing device and the depressurizing amount by the depressurizing device, and includes, for example, a regulator. Although not particularly limited, the pressure adjustment unit 36 can regulate the pressure in the pressure chamber 43 in the range of −60 kPa to 800 kPa.

The temperature adjustment unit 37 is a unit for supplying a refrigerant and a hot medium to the heat sinks 443 and 462 of the respective pressure chamber 43 of the application unit 40 in order to adjust the temperature of the sensor 90. The temperature adjustment unit 37 is capable of adjusting the temperature of the sensor 90 through the heat sinks 443 and 462 in the range of −40° C. to +150° C. As shown in FIG. 15, the temperature adjustment unit 37 has a heat exchangers 371 and 372, a refrigerant container 373, a hot medium container 374, a pump 375, flow paths 376a to 376c, and values 377a to 377d.

The heat exchanger 371 has a flow path connected to the refrigerant container 373 and a flow path connected to the heat sinks 443 and 462, and cools the refrigerant to be supplied to the heat sinks 443 and 462 by heat exchange between the flow paths. The heat exchanger 371 and the valves 377a and 377c are connected via a flow path 376a.

The heat exchanger 372 also has a flow path connected to the hot medium container 374 and a flow path connected to the heat sinks 443 and 462, and heats the hot medium to be supplied to the heat sinks 443 and 462 by heat exchange between the flow paths. The heat exchanger 372 and the valves 377b and 377d are connected via a flow path 376b.

The temperature adjustment unit 37 adjusts the flow rate of the refrigerant by the valve 377a and adjusts the flow rate of the hot medium by the valve 377b. The refrigerant and the hot medium whose flow rates are adjusted are supplied to the heat sink 443 via the pipes 444b and 444c and mixed in the heat sink 443. At this time, by changing the mixing ratio of the refrigerant and the hot medium by the valves 377a and 377b, it is possible to adjust the temperature of the mixed liquid in the heat sink 443. The heat of the mixed liquid in the heat sink 443 is transferred to the sensor 90 via the socket 445, thereby the temperature of the sensor 90 is adjusted.

Similarly, the temperature adjustment unit 37 adjusts the flow rate of the refrigerant by the valve 377c and adjusts the flow rate of the hot medium by the valve 377d. The refrigerant and the hot medium whose flow rates are adjusted are supplied to the heat sink 462 via the pipes 463a and 463b, and the refrigerant and the hot medium are mixed in the heat sink 462. At this time, by changing the mixing ratio of the refrigerant and the hot medium by the valves 377c and 377d, it is possible to adjust the temperature of the mixed liquid in the heat sink 462. The heat of the mixed liquid in the heat sink 462 is transferred to the sensor 90 via the convex portion 461 of the pusher 6, thereby the temperature of the sensor 90 is adjusted.

The heat sink 443 is connected to the flow path 376c via a pipe 444d. The heat sink 462 is also connected to the flow path 376c via a pipe 463c. The mixed liquid discharged from the heat sinks 443 and 462 returns to the heat exchangers 371 and 372 via the flow path 376c. The pump 375 is provided in the flow path 376c and pumps the mixed liquid.

In the present embodiment, the refrigerant and the hot medium are supplied to all (a total of 8) heat sinks 443 and 462 of the application unit 40 by one temperature adjustment unit 37, but this is not particularly limited. For example, the test cell may include the four temperature adjustment units, and one temperature adjustment unit may be configured to supply the refrigerant and the hot medium to the heat sinks 443 and 462 of one application device 42. Alternatively, the test cell may include two temperature adjustment units, and the refrigerant and the hot medium may be supplied to the four heat sinks 443 by one temperature adjustment unit, and the refrigerant and the hot medium may be supplied to the four heat sinks 462 by the other temperature adjustment unit.

Hereinafter, the operation of the application unit 40 will be described with reference to FIGS. 16(a) to 18. FIGS. 16(a) to 17(c) are cross-sectional views (No. 1 to No. 6) showing the operation of the application unit in the present embodiment, and FIG. 18 is an enlarged view of the XVIII portion in FIG. 17(c).

First, the first suction hand 335 (second suction hand 339) of the conveying robot 33 holding the untested sensor 90 is moved above the window 412a of the lid 412, and the shutter 413 of the dry chamber 41 is moved to open the window 412a (refer to FIG. 16(a)).

Next, the first suction head 335 (second suction hand 339) of the conveying robot 33 is lowered, and the sensor 90 is placed on the socket 445 provided in the base portion 44 (refer to FIG. 16(b)). In this state, the head portion 45 is retreated from above the base portion 44.

Next, the first suction head 335 (second suction hand 339) of the conveying robot 34 is raised and retreated from the application unit 40 (refer to FIG. 16(c)). Next, the shutter 413 of the dry chamber 41 is moved to close the window 412a (see FIG. 17(a)).

Next, the head portion 45 is moved above the base portion 44 by driving the actuator 472 (refer to FIG. 17(b)). Next, the actuator 484 of the pressing mechanism 48 is driven to move the cam plate 481 toward the head portion 45 (refer to FIG. 17(c)). As a result, the cam follower 464 of the pusher 46 rolls along the cam groove 482 of the cam plate 481, and the pusher 46 of the head portion 45 descends.

When the pusher 46 comes into contact with the base portion 44, as shown in FIG. 18, a sealed space 431 including a concave portion 441 is formed between the pusher 46 and the base portion 44. In this state, the sensor 90 is pressed against the socket 445 by the convex portion 461 of the pusher 46, and is electrically connected to the socket 445.

Next, the sensor 90 is tested. Specifically, first, the temperature of the sensor 90 is adjusted to a predetermined value by supplying a refrigerant and a hot medium from the temperature adjustment unit 37 to the heat sinks 443 and 462 of the base portion 44 and the head portion 45. Next, the pressure adjustment unit 36 adjusts the pressure of the atmosphere in the sealed space 431 to a predetermined value, thereby applying a predetermined value of pressure to the sensor 90. Then, in a state in which the temperature of the sensor 90 is maintained at a predetermined temperature and a predetermined pressure is applied to the sensor 90, the test unit 35 acquires an electric signal output from the sensor 90 via the socket 445, and judges the quality of the sensor 90.

As described above, the test object of the sensor test system 1 may be a sensor other than a pressure sensor, and in this case, it is necessary to change the application unit of each test cell 30. For example, when the test object of the sensor test system 1 is a differential pressure sensor, an application unit having an application device shown in FIG. 19 is used. When the test object of the sensor test system 1 is a magnetic sensor, an application unit having an application device shown in FIG. 20 is used.

FIG. 19 is a diagram showing a first modification of the application device in the present embodiment, and is a cross-sectional view of an application device for a differential pressure sensor.

As shown in FIG. 19, the differential pressure sensor 91 has two pressure application port 911 and 912. The differential pressure sensor 91 detects a first pressure through a first pressure application port 911 and detects a second pressure through a second pressure application port 912. The first pressure and the second pressure are pressure values different from each other, and the differential pressure sensor 91 calculates a difference between the first pressure and the second pressure, and outputs an electric signal according to the calculation result.

When the test object of the sensor test system 1 is the differential pressure sensor 91, an application unit in which the application device 42 is replaced with the application device 52 shown in FIG. 19 is used as the application unit for the differential pressure sensor. This application unit has the same configuration as the above described application unit 40 except that the application device 42 is replaced with the application device 52.

As shown in FIG. 19, the differential pressure sensor application device 52 includes a base portion 54, a head portion 55, and a pressing mechanism (not shown). The pressing mechanism has the same configuration as the pressing mechanism 48 described above.

The base portion 54 is fixed to the bottom surface of the housing of the dry chamber so as to face the window of the lid of the dry chamber. A socket 541 is provided on the upper surface of the base portion 54. The socket 541 has the same configuration as the socket 445 described above, and is electrically connected to the test unit 35.

A heat sink 542 is formed inside the base portion 54. The heat sink 542 has the same configuration as the heat sink 443 described above, and is connected to the temperature adjustment unit 37. The heat sink 542 is provided directly below the socket 541, and can heat/cool the sensor 91 through the socket 541.

The head portion 55 includes a pusher 56, a first pressure nozzle 57, a second pressure nozzle 58, and a holding plate (not shown). The holding plate has the same configuration as the holding plate 47 described above, and movably holds the pusher 56 via a stopper and a coil spring, and is movable in the Y direction by an actuator.

The first and second pressure nozzles 57 and 58 pass through the pusher 56 and are exposed at the tip of the pusher 56. An O-ring 571 is attached to the tip of the first pressure nozzle 57, and an O-ring 581 is also attached to the tip of the second pressure nozzle 58. The first pressure nozzle 57 is connected to the first pressure adjustment unit 36A, and the second pressure nozzle 58 is connected to the second pressure adjustment unit 36B. The test cell including the application device 52 for the differential pressure sensor includes two pressure adjustment units 36A and 36B instead of the pressure adjustment unit 36, and the first and second pressure adjustment units 36A and 36B have the same configuration as that of the pressure adjustment unit 36 described above, respectively. Different pressures are supplied from the first and second pressure adjustment units 36A and 36B.

Since the first and second pressure nozzles 57 and 58 are exposed at the center of the distal end surface of the pusher 56, the outer peripheral portion of the distal end surface of the pusher 56 contacts the sensor 91. A heat sink 561 is provided inside the pusher 56. The heat sink 561 has the same configuration as the heat sink 462 described above, and is connected to the temperature adjustment unit 37. Although not shown in particular, the pusher 56 has a cam follower (not shown) having the same configuration as the cam follower 464 described above.

The test using the application unit including the application device 52 is performed as follows. That is, when the sensor 91 is placed on the socket 541, the head portion 55 moves horizontally above the sensor 91. Next, the head portion 55 is lowered by the horizontal movement of the pressing mechanism, thereby the sensor 91 is pressed against the socket 541 by the pusher 56, and the sensor 91 and the socket 541 are electrically connected to each other. At the same time, the first pressure nozzle 57 is connected to the first pressure application port 911 of the sensor 91, and the second pressure nozzle 58 is connected to the second pressure application port 912 of the sensor 91.

The sensor 91 is then tested. Specifically, first, the temperature of the sensor 91 is adjusted to a predetermined value by supplying a refrigerant and a hot medium from the temperature adjustment unit 37 to the heat sinks 542 and 561 of the base portion 54 and the head portion 55. Next, a first pressure is applied to the first pressure application port 911 of the sensor 91 by the first pressure adjustment unit 36A, and a second pressure is applied to the second pressure application port 912 of the sensor 91 by the second pressure adjustment unit 36B. Then, the test unit 35 executes the test of the sensor 91 through the socket 541 while maintaining the temperature of the sensor 91 and applying the first and second pressures to the sensor 91.

The first and second pressure nozzles 57 and 58 in the present embodiment correspond to an example of the "differential pressure application part" in the present invention, and the heat sinks 542 and 561 in the present embodiment correspond to an example of the "temperature adjustment part" in the present invention.

FIG. 20 is a diagram showing a second modification of the application device in the present embodiment, and is a cross-sectional view of an application device for a magnetic sensor.

The magnetic sensor 92 detects the magnitude of the magnetic field applied to the magnetic sensor 92, and outputs an electric signal according to the detection result. The use application of the magnetic sensor 92 is not particularly limited, and is, for example, a current sensor.

When the test object of the sensor test system 1 is the magnetic sensor 92, an application unit in which the application device 42 is replaced with the application device 62 shown in FIG. 20 is used as the application unit for the magnetic sensor. This application unit has the same configuration as the described above application unit 40 except that the application device 42 is replaced with the application device 62.

As shown in FIG. 20, the application device 62 for a magnetic sensor includes a base portion 64, a head portion 65, a pair of electromagnets 67, and a pressing mechanism (not shown). The pressing mechanism has the same configuration as the pressing mechanism 48 described above.

The base portion 64 is fixed to the bottom surface of the housing of the dry chamber so as to face the window of the lid of the dry chamber. A socket 641 is provided on the upper surface of the base portion 64. The socket 641 has the same configuration as the socket 445 described above, and is electrically connected to the test unit 35.

A heat sink 642 is formed inside the base portion 64. The heat sink 642 has the same configuration as the heat sink 443 described above, and is connected to the temperature adjustment unit 37. The heat sink 642 is provided directly below the socket 641, and can heat/cool the magnetic sensor 92 through the socket 641.

The head portion 65 includes a pusher 66 and a holding plate (not shown) for holding the pusher 66. The holding plate has the same configuration as the holding plate 47 described above, and movably holds the pusher 66 via a stopper and a coil spring, and is movable in the Y direction by an actuator.

A heat sink 661 is provided inside the pusher 66. The heat sink 661 has the same configuration as the heat sink 462 described above, and is connected to the temperature adjustment unit 37. Although not shown in particular, the pusher 66 has a cam follower (not shown) having the same configuration as the cam follower 464 described above.

The pair of electromagnets 67 are disposed opposite to each other so as to sandwich the sensor 92 being on the socket 641. Each electromagnet 67 has a core 671 and a coil 675.

The core 671 is a ferrite (iron core) for increasing the magnetic flux generated in the coil 675 and allowing a closed loop (magnetic circuit) formed by the magnetic flux to pass through the magnetic sensor 92. The core 671 has a main body 672, a first protrusion 673, and a second protrusion 674. The main body portion 672 is a columnar portion extending along the normal direction (Z direction) of the main surface of the socket 641, and the coil 675 is wound around the main body portion 672. The first projecting portion 673 projects from the upper end of the main body portion 672 toward the first projecting portion 673 of the other electromagnet 67. The magnetic sensor 92 connected to the socket 641 is interposed between the pair of first protrusions 673. The second projecting portion 674 also projects from the lower end of the main body portion 672 toward the second projecting portion 674 of the other electromagnet 67, and the pair of second projecting portions 674 face each other.

The coil 675 is a conductive wire wound around the main body 672 of the core 671, and is connected to the magnetic field adjustment unit 38. The test cell including the application device 62 for the magnetic sensor includes a magnetic field adjustment unit 38 instead of the pressure adjustment unit 36. When a current flows from the magnetic field adjustment unit 38 to the coil 675, a magnetic flux is generated, and the magnetic flux forms a closed loop such as the main body 671 of one core 671, the first protrusion 672 of one core 671, the magnetic sensor 92, the first protrusion 672 of the other core 671, the main body 671 of the other core 671, the second protrusion 673 of the other core 671, and the second protrusion 672 of the one core 671.

The test using the application unit including the application device 62 is performed as follows. That is, when the sensor 92 is placed on the socket 641, the head portion 65 moves above the sensor 92. Next, the head portion 65 is lowered by the horizontal movement of the pressing mechanism, thereby the sensor 92 is pressed against the socket 641 by the pusher 66, and the sensor 92 and the socket 641 are electrically connected to each other. At the same time, the sensor 92 is positioned between the first protrusions 673 of the pair of cores 671 facing each other.

The sensor 92 is then tested. Specifically, first, the temperature of the sensor 92 is adjusted to a predetermined value by supplying a refrigerant and a hot medium from the temperature adjustment unit 37 to the heat sinks 642 and 661 of the base portion 64 and the head portion 65. Next, a magnetic field of a predetermined strength is applied to the sensor 92 by the magnetic adjustment unit 38. Then, the test unit 35 executes the test of the sensor 92 through the socket 641 while maintaining the temperature of the sensor 92 and applying a magnetic field to the sensor 92.

The pair of electro-magnetic 67 in the present embodiment corresponds to an example of the "magnetic field application part" in the present invention, heat sinks 642 and 661 in the present embodiment corresponds to an example of the "temperature adjustment part" in the present invention.

Returning to FIG. 1, in the sensor test system 1 of the present embodiment, when the sensor 90 is carried from the loader 10 into the test cell group 20, the first test is performed in the first test cell 30A. The first test is, for example, a low pressure test under a low temperature environment. When the test in the test cell 30A is completed, the sensor 90 is conveyed to the next test cell 30B by the moving device 70.

The second test is performed in the test cell 30B. The second test is a test under different conditions from the first test, for example, a high-pressure test under a low temperature environment. When the test in the test cell 30B is completed, the sensor 90 is conveyed to the next test cell 30C by the moving device 70.

A third test is performed in the test cell 30C. The third test is a test under different conditions from the first and second tests, for example, a low pressure test under a high temperature environment. When the test in the test cell 30C is completed, the sensor 90 is conveyed to the final test cell 30D by the moving device 70.

A fourth test is performed in the test cell 30D. The fourth test is a test under different conditions from the first to third tests, for example, a high-pressure test under a high-temperature environment. When the test in the test cell 30D is completed, the sensor 90 is discharged from the test cell group 20 by the unloader 80.

In this manner, by sequentially performing the tests of the sensors 90 by the test cells 30A to 30D, it is possible to execute a plurality of types (four types in this example) of tests, for one sensor 90. The content of the first to fourth tests is not particularly limited to the above.

As described above, in the present embodiment, since the pressure chamber 43 can apply pressure to the pressure sensor 90, and the conveying robot 33 can convey the pressure sensor 90 into and out of the application unit 40 including the socket 445 and the pressure chamber 43, it is possible to efficiently performed the test of the sensor.

Further, in the present embodiment, the plurality of application devices 42 each have a pusher 46 and a moving mechanism (an actuator 472 and a pressing mechanism 48), and the moving mechanism is independent of the conveying robot 33. Therefore, in the present embodiment, since the operation of conveying the sensor 90 into and out of the application unit 40 and the operation of pressing the sensor 90 against the socket 445 can be performed independently, it is possible to further improve throughput in the test cell 30.

Embodiments heretofore explained are described to facilitate understanding of the present invention and are not described to limit the present invention. It is therefore intended that the elements disclosed in the above embodiments include all design changes and equivalents to fall within the technical scope of the present invention.

EXPLANATIONS OF LETTERS OR NUMERALS

1 . . . sensor test system
10 . . . loader
20 . . . test cell group
30, 30A to 30D . . . test cell
301 . . . apparatus main body
302 . . . base
305 . . . cover
307a-307c . . . opening
31 . . . preheat part
40 . . . application unit
41 . . . dry chamber
42 . . . application device
43 . . . pressure chamber
431 . . . sealed space
44 . . . base portion
441 . . . concave portion
443 . . . heat-sink
445 . . . socket
45 . . . head portion
46 . . . pusher
462 . . . heat sink
464 . . . cam follower
47 . . . holding plate
472 . . . actuator
48 . . . pushing mechanism
481 . . . cam plate
484 . . . actuator
52 . . . application device
56 . . . pusher
57 . . . first pressure nozzle
58 . . . second pressure nozzle
62 . . . application device
67 . . . electromagnet
671 . . . core 675 . . . coil
32 . . . heat removal part
33 . . . conveying robot
332 . . . first articulated arm
336 . . . second articulated arm
34 . . . control unit
35 . . . test unit
36 . . . pressure adjustment unit
37 . . . temperature adjustment unit
70 . . . moving device
80 . . . unloader
90, 90' . . . pressures sensor
91 . . . differential pressure sensor
92 . . . magnetic sensor

The invention claimed is:

1. A sensor test apparatus for testing a sensor that includes an individualized die and that detects a first physical quantity, the sensor test apparatus comprising:
an application unit comprising a plurality of application devices, each of the application devices including:
a socket to which the sensor is electrically connected,
a first application part that applies the first physical quantity to the sensor,
a second application part that applies a second physical quantity to the sensor, the second physical quantity being different from the first physical quantity, and
a pusher that contacts the sensor and presses the sensor against the socket;
a test unit that tests the sensor via the socket based on a signal output from the sensor, the signal corresponding to the first physical quantity detected by the sensor; and
a conveying device that conveys the sensor into and out of the application unit, wherein
the second application part is a temperature adjustment part that applies a thermal stress as the second physical quantity to the sensor to adjust the temperature of the sensor,
the conveying device conveys the sensor toward the socket from above the socket and places the sensor on the socket, and
the pusher presses the sensor against the socket downwardly to electrically connect the sensor to the socket for testing the sensor including the individualized die after the conveying device releases the sensor.

2. The sensor test apparatus according to claim 1, wherein the temperature adjustment part is disposed in the pusher.

3. The sensor test apparatus according to claim 1, wherein each of the application devices includes a movement mechanism that moves the pusher relative to the socket.

4. The sensor test apparatus according to claim 1, wherein the first application part is a pressure application part that applies a pressure to the sensor.

5. The sensor test apparatus according to claim 1, wherein the first application part is a differential pressure application part that applies two kinds of pressures to the sensor.

6. The sensor test apparatus according to claim 1, wherein the first application part is a magnetic field application part that applies a magnetic field to the sensor.

7. The sensor test apparatus according to claim 1, wherein the sensor test apparatus comprises an apparatus main body housing the application unit, the test unit, and the conveying device,
the apparatus main body has
a first opening through which the sensor is fed to a first position in the sensor test apparatus, and
a second opening through which the sensor is ejected from a second position in the sensor test apparatus, and
the conveying device moves an untested sensor from the first position to the application unit and moves a tested sensor from the application unit to the second position.

8. A sensor test apparatus for testing a sensor that detects a first physical quantity, the sensor test apparatus comprising:
an application unit comprising at least one application device, the application device including:
a socket to which the sensor is electrically connected,
a first application part that applies the first physical quantity to the sensor, and
a second application part that applies a second physical quantity to the sensor, the second physical quantity being different from the first physical quantity;
a test unit that tests the sensor via the socket; and
a conveying device that conveys the sensor into and out of the application unit, wherein
the sensor test apparatus comprises an apparatus main body housing the application unit, the test unit, and the conveying device,
the apparatus main body has:
a first opening through which the sensor is fed to a first position in the sensor test apparatus, and
a second opening through which the sensor is ejected from a second position in the sensor test apparatus, and
the conveying device moves an untested sensor from the first position to the application unit and moves a tested sensor from the application unit to the second position,
the sensor test apparatus comprises:
a preheat part that is disposed between the first position and the application unit and that applies a thermal stress to the sensor before being conveyed into the application unit; and
a heat removal part that is disposed between the application unit and the second position and that removes a thermal stress from the sensor after being conveyed out of the application unit; and
the conveying device moves the untested sensor from the first position to the preheat part, moves the untested sensor from the preheat part to the application unit, moves the tested sensor from the application unit to the heat removal part, and moves the tested sensor from the heat removal part to the second position.

9. The sensor test apparatus according to claim 8, wherein, in plan view, the first position, the preheat part, the application unit, the heat removal part, and the second position are arranged in a substantially U-shape around the conveying device.

10. The sensor testing apparatus according to claim 8, wherein the conveying device is a horizontal articulated robot having first and second articulated arms sharing a first rotation axis,
the first articulated arm moves the untested sensor from the first position to the preheat part and moves the untested sensor from the preheat part to the application unit, and
the second articulated arm moves the tested sensor from the application unit to the heat removal part and moves the tested sensor from the heat removal part to the second position.

11. The sensor test apparatus according to claim 1, wherein
the sensor test apparatus comprises:

a preheat part that is disposed between a first position and the application unit and that applies a thermal stress to the sensor before being conveyed into the application unit; and a heat removal part that is disposed between the application unit and a second position and that removes a thermal stress from the sensor after being conveyed out of the application unit.

12. The sensor test apparatus according to claim 1, wherein the application unit includes a dry chamber that accommodates the application devices and that is filled with dry air.

13. The sensor test apparatus according to claim 8, wherein the application unit includes a dry chamber that accommodates the application device and that is filled with dry air.

\* \* \* \* \*